(12) United States Patent
Chu et al.

(10) Patent No.: US 11,289,396 B2
(45) Date of Patent: Mar. 29, 2022

(54) SENSING COMPONENT ENCAPSULATED BY AN ENCAPSULATION LAYER WITH A ROUGHNESS SURFACE HAVING A HOLLOW REGION

(71) Applicant: Taiwan Semiconductor Manufacturing Company, Ltd., Hsinchu (TW)

(72) Inventors: Yung-Chi Chu, Kaohsiung (TW); Hung-Jui Kuo, Hsinchu (TW); Yu-Hsiang Hu, Hsinchu (TW); Sih-Hao Liao, New Taipei (TW); Tian Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/031,915

(22) Filed: Sep. 25, 2020

(65) Prior Publication Data

US 2021/0098328 A1 Apr. 1, 2021

Related U.S. Application Data

(60) Provisional application No. 62/907,711, filed on Sep. 29, 2019.

(51) Int. Cl.
*H01L 23/02* (2006.01)
*H01L 23/12* (2006.01)
(Continued)

(52) U.S. Cl.
CPC .......... *H01L 23/3192* (2013.01); *H01L 21/56* (2013.01); *H01L 23/3185* (2013.01);
(Continued)

(58) Field of Classification Search
CPC ............. H01L 23/3192; H01L 23/3185; H01L 23/585; H01L 23/481; H01L 24/24; H01L 24/82; H01L 21/56; H01L 2924/181
See application file for complete search history.

(56) References Cited

U.S. PATENT DOCUMENTS

| | | | |
|---|---|---|---|
| 7,638,887 B2 * | 12/2009 | Tsao | ................. H01L 27/14683 257/787 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |

(Continued)

*Primary Examiner* — Alonzo Chambliss
(74) *Attorney, Agent, or Firm* — JCIPRNET

(57) ABSTRACT

A semiconductor package includes a semiconductor die including a sensing component, an encapsulant extending along sidewalls of the semiconductor die, a through insulator via (TIV) and a dummy TIV penetrating through the encapsulant and disposed aside the semiconductor die, a patterned dielectric layer disposed on the encapsulant and exposing the sensing component of the semiconductor die, a conductive pattern disposed on the patterned dielectric layer and extending to be in contact with the TIV and the semiconductor die, and a first dummy conductive pattern disposed on the patterned dielectric layer and connected to the dummy TIV through an alignment opening of the first patterned dielectric layer. The semiconductor die is in a hollow region of the encapsulant, and a top width of the hollow region is greater than a width of the semiconductor die.

20 Claims, 21 Drawing Sheets

(51) Int. Cl.
*H01L 21/00* (2006.01)
*H01L 21/4763* (2006.01)
*H01L 23/31* (2006.01)
*H01L 23/00* (2006.01)
*H01L 23/58* (2006.01)
*H01L 21/56* (2006.01)
*H01L 23/48* (2006.01)

(52) U.S. Cl.
CPC .......... *H01L 23/481* (2013.01); *H01L 23/585* (2013.01); *H01L 24/24* (2013.01); *H01L 24/82* (2013.01); *H01L 2224/24105* (2013.01); *H01L 2224/24155* (2013.01); *H01L 2224/73267* (2013.01); *H01L 2224/82101* (2013.01); *H01L 2224/82106* (2013.01); *H01L 2924/181* (2013.01)

(56) References Cited

U.S. PATENT DOCUMENTS

| | | | |
|---|---|---|---|
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,832,985 B2* | 11/2020 | Chiang | H01L 21/56 |
| 11,004,786 B2* | 5/2021 | Tai | H01L 23/49811 |
| 11,075,131 B2* | 7/2021 | Tsai | H01L 23/02 |
| 2012/0217607 A1* | 8/2012 | Hanai | H01L 27/14636 257/448 |
| 2013/0221455 A1* | 8/2013 | Manack | G01J 5/045 257/416 |
| 2021/0280511 A1* | 9/2021 | Tai | H01L 24/09 |
| 2021/0343638 A1* | 11/2021 | Chu | H01L 23/5226 |

* cited by examiner

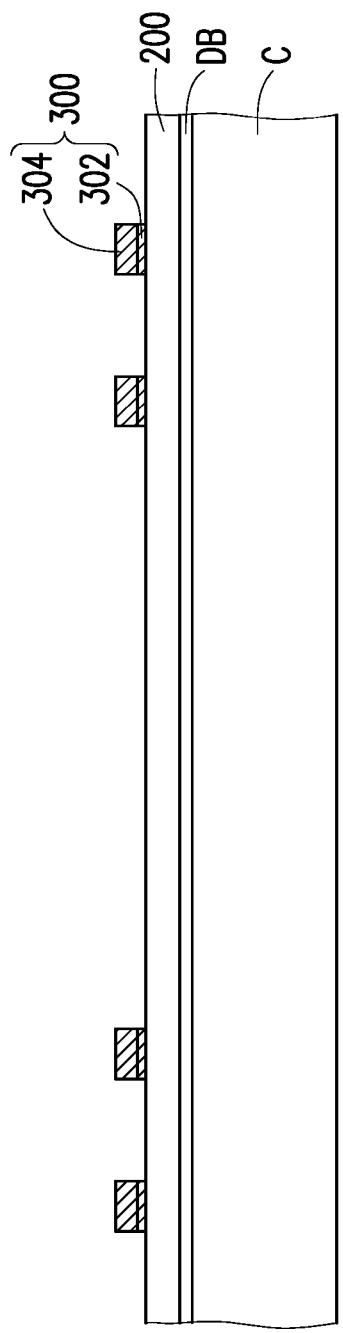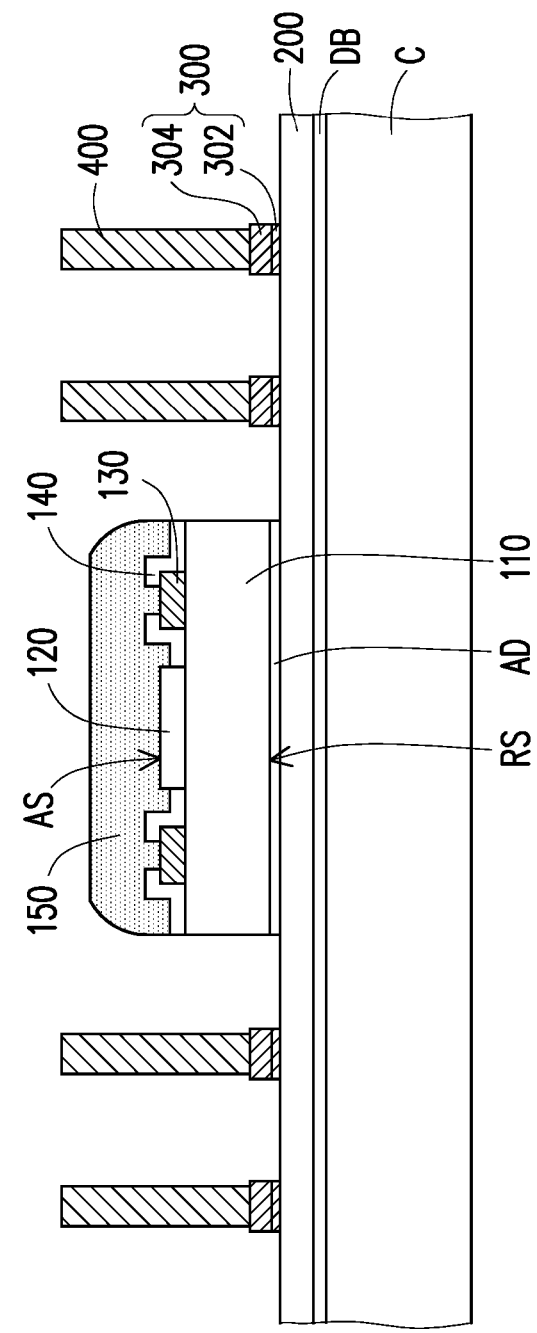

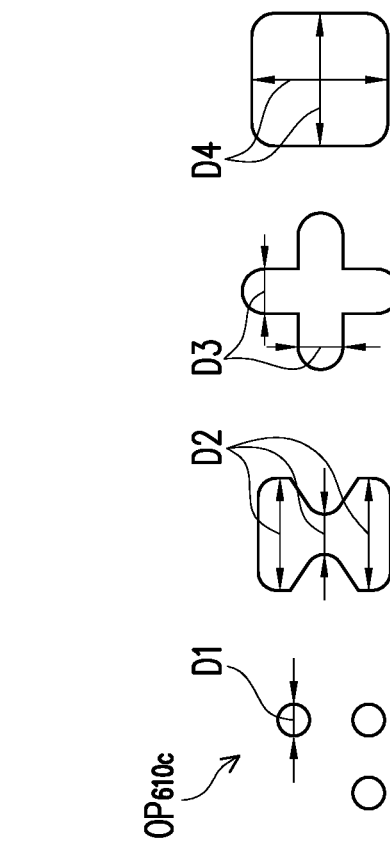
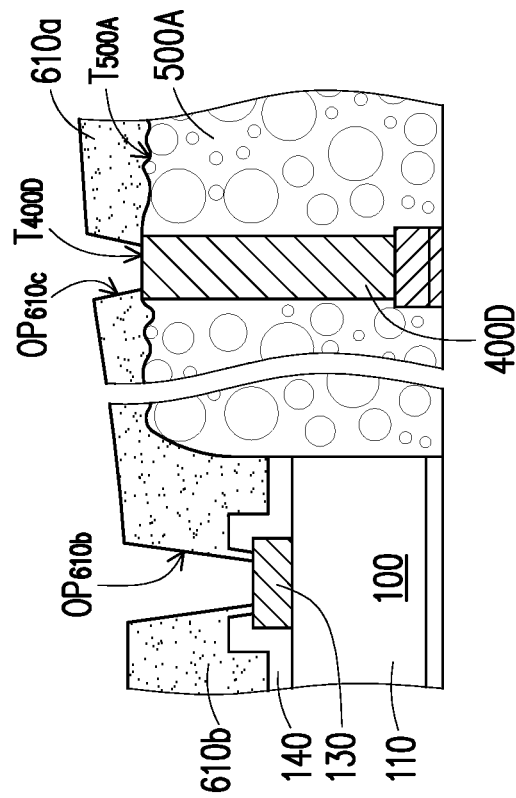
FIG. 4C
FIG. 4B

SENSING COMPONENT ENCAPSULATED BY AN ENCAPSULATION LAYER WITH A ROUGHNESS SURFACE HAVING A HOLLOW REGION

CROSS-REFERENCE TO RELATED APPLICATION

This application claims the priority benefit of U.S. provisional application Ser. No. 62/907,711, filed on Sep. 29, 2019. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, these improvements in integration density have come from repeated reductions in minimum feature size, which allows more components to be integrated into a given area. Technological advances in integrated circuit (IC) design have produced generations of ICs where each generation has smaller and more complex circuit designs than the previous generation. Currently, integrated fan-out packages are becoming increasingly popular for their compactness. The relatively new types of packaging technologies for semiconductors face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2L are schematic cross-sectional views of various stages of manufacturing a semiconductor package in accordance with some embodiments.

FIG. 4B is a schematic cross-sectional view illustrating partial structure taken along line A-A' in FIG. 4A in accordance with some embodiments.

FIG. 4C illustrates different shapes of alignment openings in accordance with some embodiments.

DETAILED DESCRIPTION

Figure 1A:
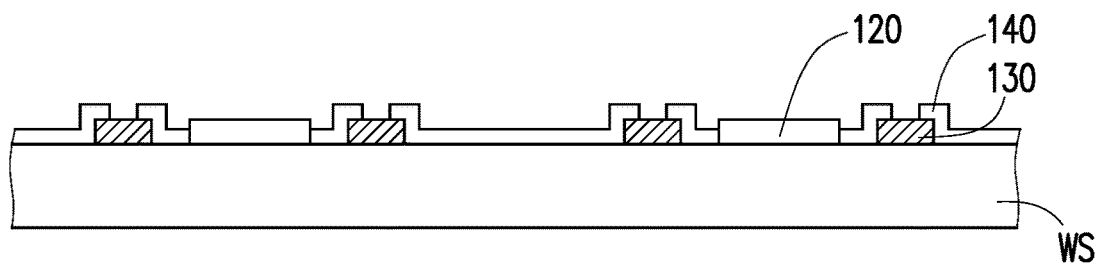
FIGS. 1A-1D are schematic cross-sectional views of various stages of manufacturing a semiconductor die in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure are discussed in the context of semiconductor manufacturing, and in particular, in the context of forming a semiconductor package including a sensing component. During fabrication of the semiconductor package, each patterned layer is aligned with the previous patterned layers with a degree of precision. Pattern alignment techniques in the present disclosure provide openings exposing a smooth surface (e.g., top surfaces of a TIV or top surface of a patterned passivation layer, etc.) as alignment openings to achieve alignment between successive layers. Moreover, alignment patterns may be formed on dummy TIVs so that the circuitry layout area is not affected and also proper alignment between successive layers is achieved. Some variations of embodiments are discussed. It should be appreciated that the illustration throughout the drawings are schematic and not in scale.

FIGS. 1A-1D are schematic cross-sectional views of various stages of manufacturing a semiconductor die in accordance with some embodiments. Referring to FIG. 1A, a semiconductor wafer WS is provided. In some embodiments, the semiconductor wafer WS is made of elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor wafer WS includes active components (e.g., transistors or the like) and/or passive components (e.g., resistors, capacitors, inductors, or the like) formed therein.

As illustrated in FIG. 1A, at least one sensing component 120, a plurality of conductive pads 130, and a patterned passivation layer 140 are formed on the semiconductor wafer WS. In some embodiments, a plurality of the sensing components 120 is disposed between adjacent conductive pads 130. For example, the conductive pads 130 surround the corresponding sensing component 120. In some embodiments, the sensing components 120 may be ultrasonic sensors which sense the vibration of air or sound. However, the disclosure is not limited thereto. In some alternative embodiments, the sensing components 120 may be photo sensors, fingerprint sensors, or the like. In some embodiments, a material of the conductive pads 130 includes aluminum, titanium, copper, nickel, tungsten, and/or alloys thereof. The conductive pads 130 may be formed by, for example, electroplating, deposition, and/or photolithography and etching. In some embodiments, a portion of the conductive pads 130 serves as alignment marks for subsequent process. It should be noted that the number of the sensing components 120 and the number of the conductive pads 130 shown in FIG. 1A are merely exemplary illustrations, and the disclosure is not limited thereto. The number of the sensing components 120 and the number of the conductive pads 130 may be adjusted depending on the routing requirements.

Although FIG. 1A illustrated that the sensing components 120 are disposed on a top surface of the semiconductor wafer WS, but the disclosure is not limited thereto. In some alternative embodiments, the sensing components 120 may be embedded in the semiconductor wafer WS while being coplanar with the top surface of the semiconductor wafer WS. That is, the sensing components 120 are exposed by the semiconductor wafer WS.

In some embodiments, the patterned passivation layer 140 is formed on the semiconductor wafer WS to partially cover the conductive pads 130. For example, the patterned passivation layer 140 exposes at least a portion of each conductive pad 130 for further electrical connection. The sensing components 120 may be unmasked by the patterned passivation layer 140. In some embodiments, the patterned passivation layer 140 is a polymer layer having sufficient thickness to protect the conductive pads 130. In some embodiments, a material of the patterned passivation layer 140 includes polyimide, epoxy resin, acrylic resin, phenol resin, benzocyclobutene (BCB), polybenzoxazole (PBO), or any other suitable dielectric material. The patterned passivation layer 140, for example, may be formed by suitable fabrication techniques such as spin-on coating, chemical vapor deposition (CVD), plasma-enhanced chemical vapor deposition (PECVD), or the like.

Figure 1B:
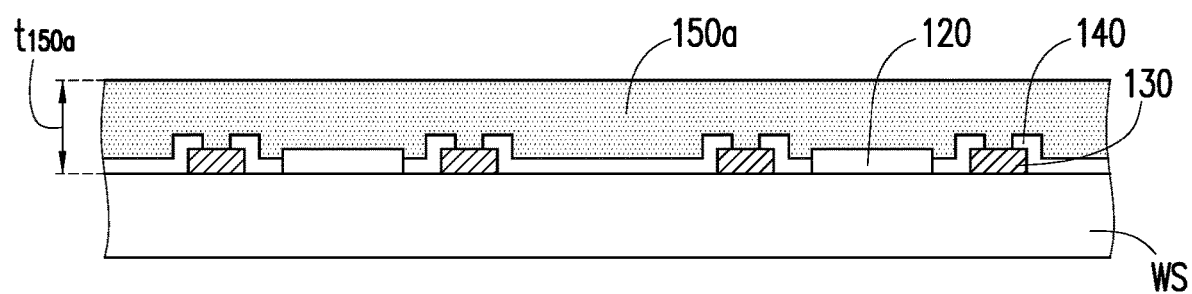

Referring to FIG. 1B, a sacrificial material layer 150a is formed over the semiconductor wafer WS to cover the sensing components 120, the conductive pads 130, and the patterned passivation layer 140. In some embodiments, the sacrificial material layer 150a may be a polybenzoxazole (PBO) layer, a polyimide (PI) layer, or other suitable polymer layer. In some alternative embodiments, the sacrificial material layer 150a is made of inorganic materials. The sacrificial material layer 150a may have sufficient thickness to protect the conductive pads 130 and the sensing components 120 therein.

Figure 1C:
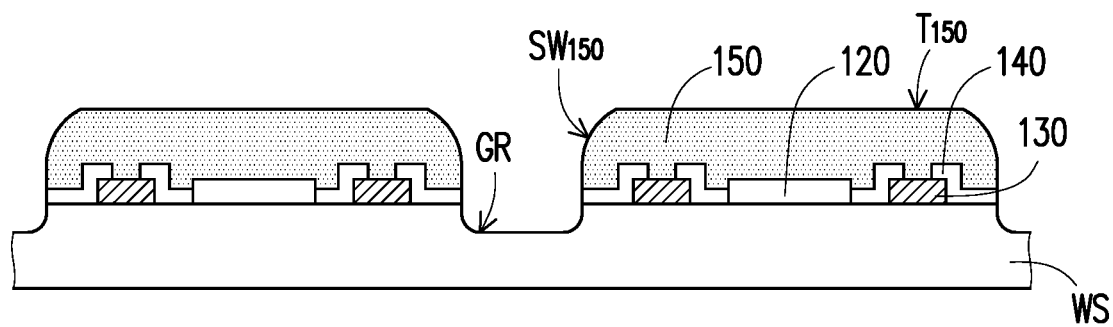

Referring to FIG. 1C and with reference to FIG. 1B, a grooving process is performed on the structure illustrated in FIG. 1B. In some embodiments, during the grooving process, a portion of the sacrificial material layer 150a is removed to form a plurality of sacrificial films 150 over the semiconductor wafer WS. Meanwhile, a plurality of grooves GR is formed in the semiconductor wafer WS. In some embodiments, the grooving process includes a laser grooving process or the like. For example, a laser beam is applied to the sacrificial material layer 150a and the semiconductor wafer WS to remove a portion of the sacrificial material layer 150a and a portion of the semiconductor wafer WS. In some embodiments, after the grooving process, each sacrificial film 150 has a substantially flat top surface $T_{150}$ and curved sidewalls $SW_{150}$.

Figure 1D:
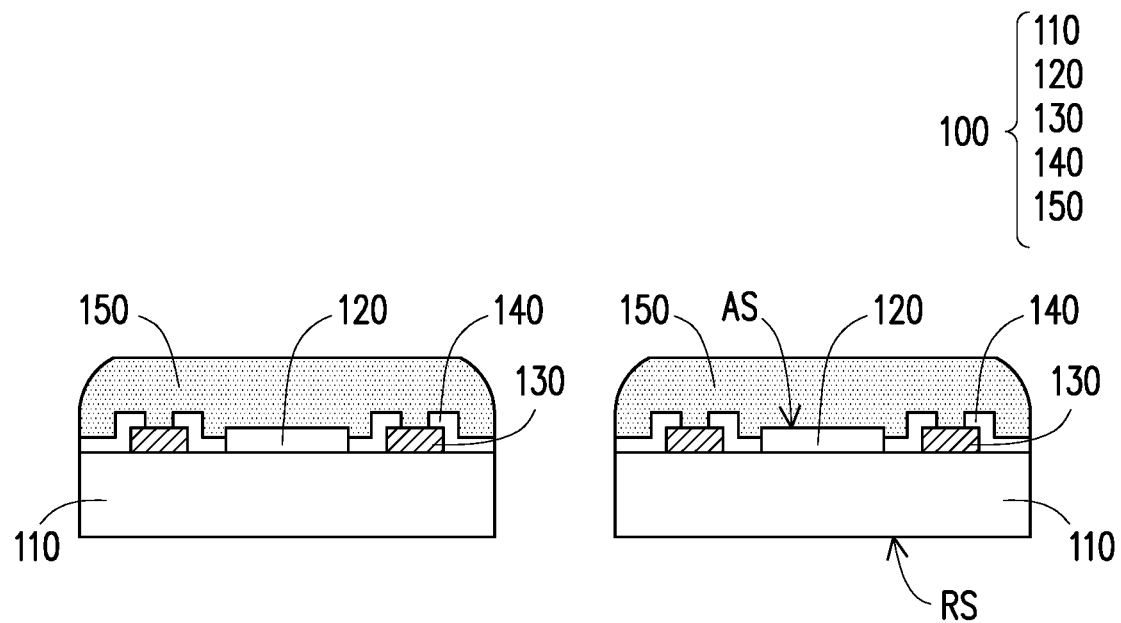

Referring to FIG. 1D and with reference to FIG. 1C, a singulation process is performed on the semiconductor wafer WS to obtain a plurality of semiconductor dies 100. In some embodiments, the dicing process or the singulation process typically involves dicing with a rotating blade or a laser beam. The dicing or singulation process is, for example, a laser cutting process, a mechanical cutting process, or other suitable processes. In some embodiments, the singulation process is performed along the grooves GR. In some embodiments, during the singulation process, the semiconductor wafer WS is divided into a plurality of semiconductor substrate 110. For example, at this stage, each semiconductor die 100 includes the semiconductor substrate 110, the sensing component 120 on the semiconductor substrate 110, the conductive pads 130 surrounding the sensing component 120, the patterned passivation layer 140 partially covering the conductive pads 130, and the sacrificial film 150. In some embodiments, the sacrificial film 150 is disposed over the semiconductor substrate 110 to protect the sensing component 120, the conductive pads 130, and the patterned passivation layer 140. In some embodiments, a top surface of the sensing component 120 and top surfaces of the conductive pads 130 may be collectively referred to as an active surface AS of the semiconductor die 100. Meanwhile, a surface of the semiconductor die 100 opposite to the active surface AS is referred to as a rear surface RS of the semiconductor die 100. Up to here, the manufacture of the semiconductor dies 100 is completed. In some embodiments, the semiconductor dies 100 is packaged to form a semiconductor package in subsequent processing as will be described later accompanying with figures.

Figure 2C:
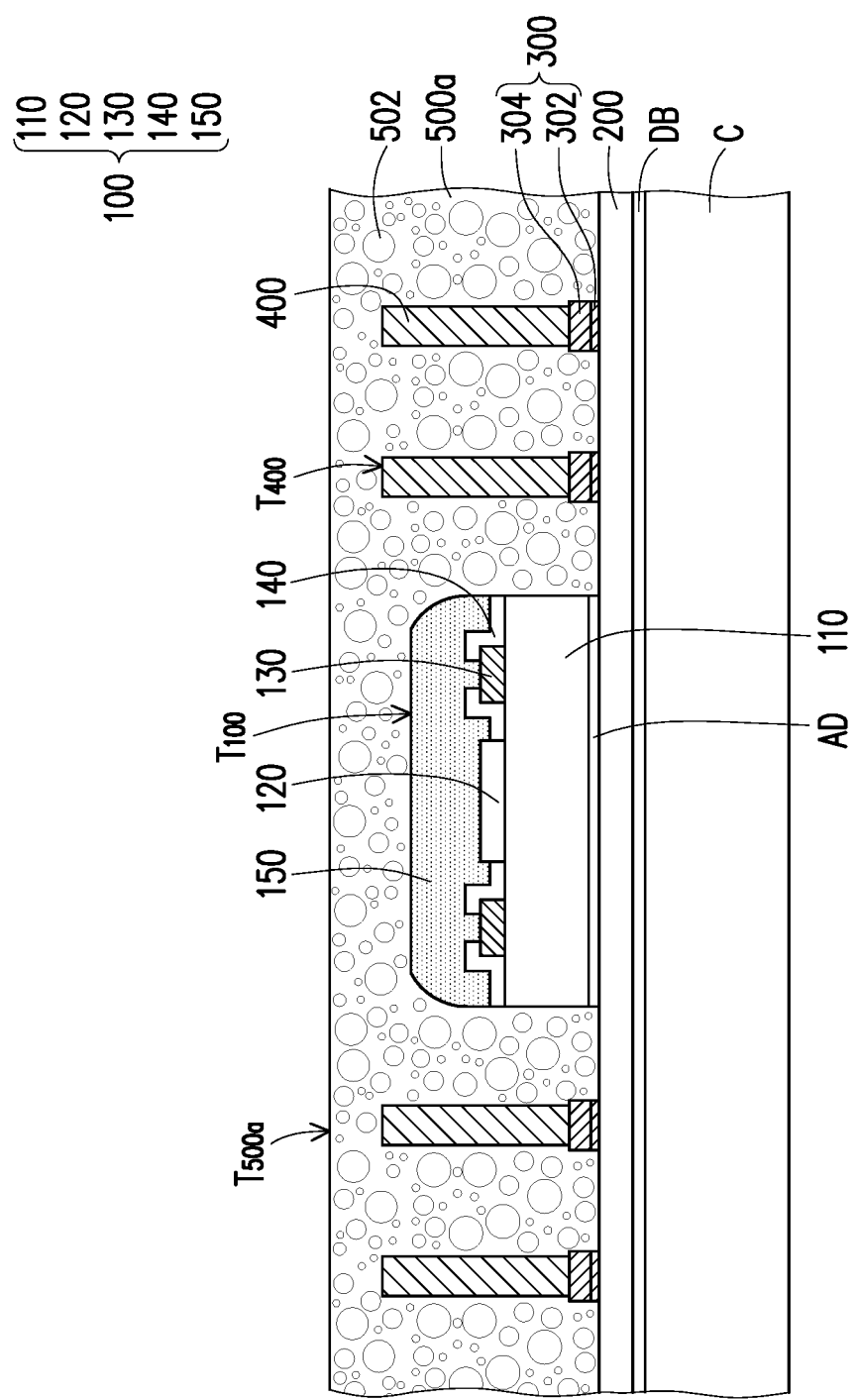
Figure 2D:
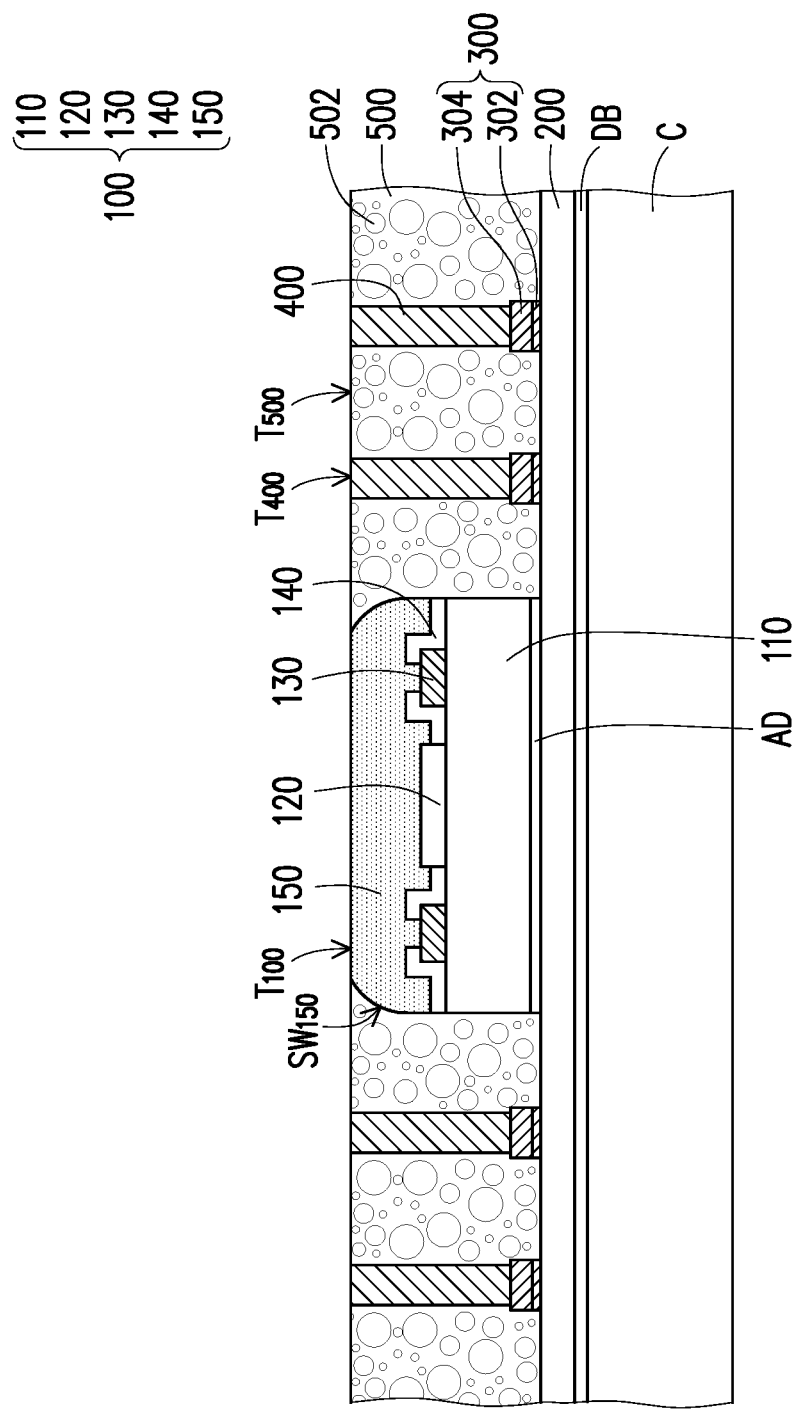
Figure 2E:
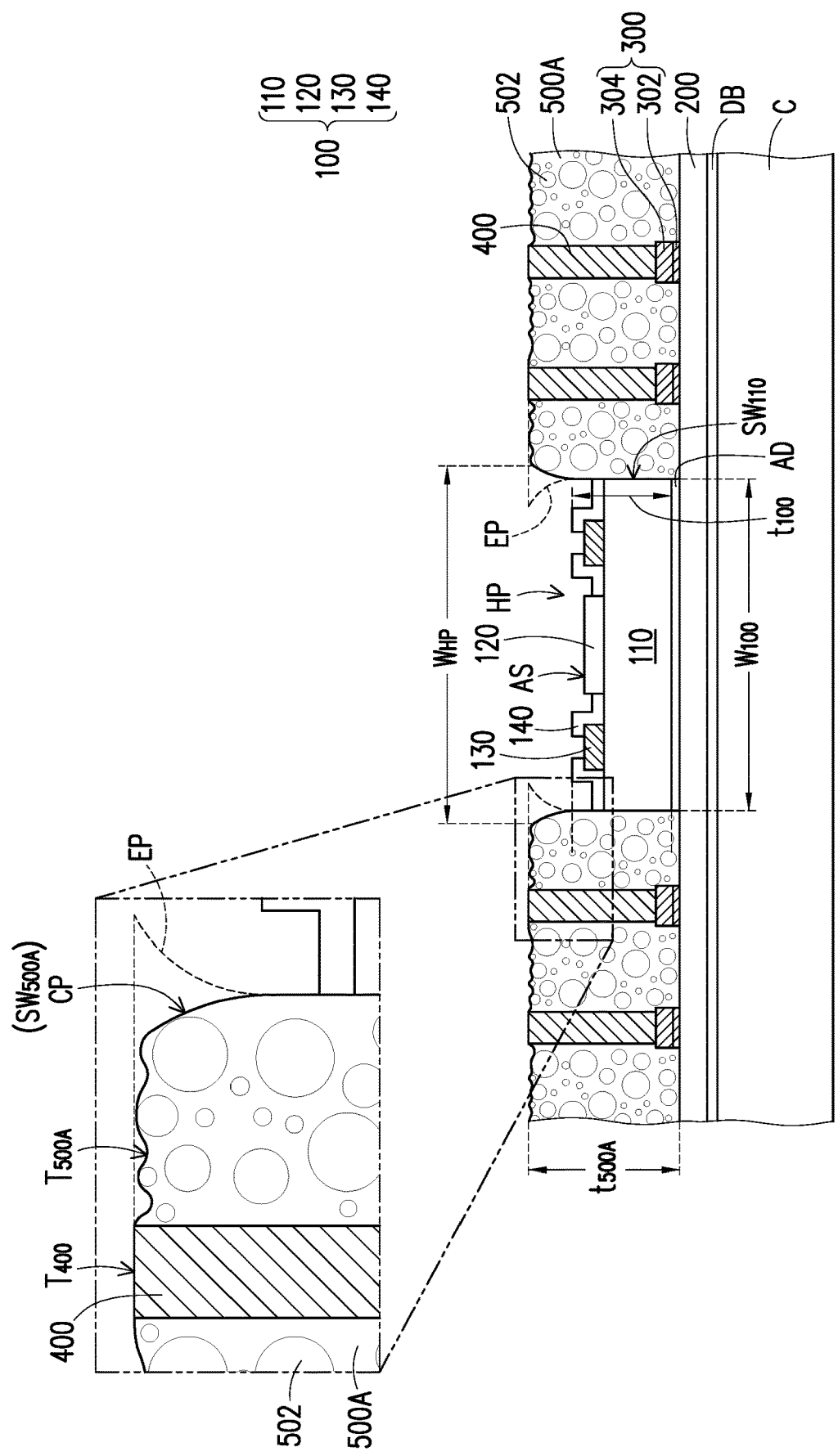
Figure 2F:
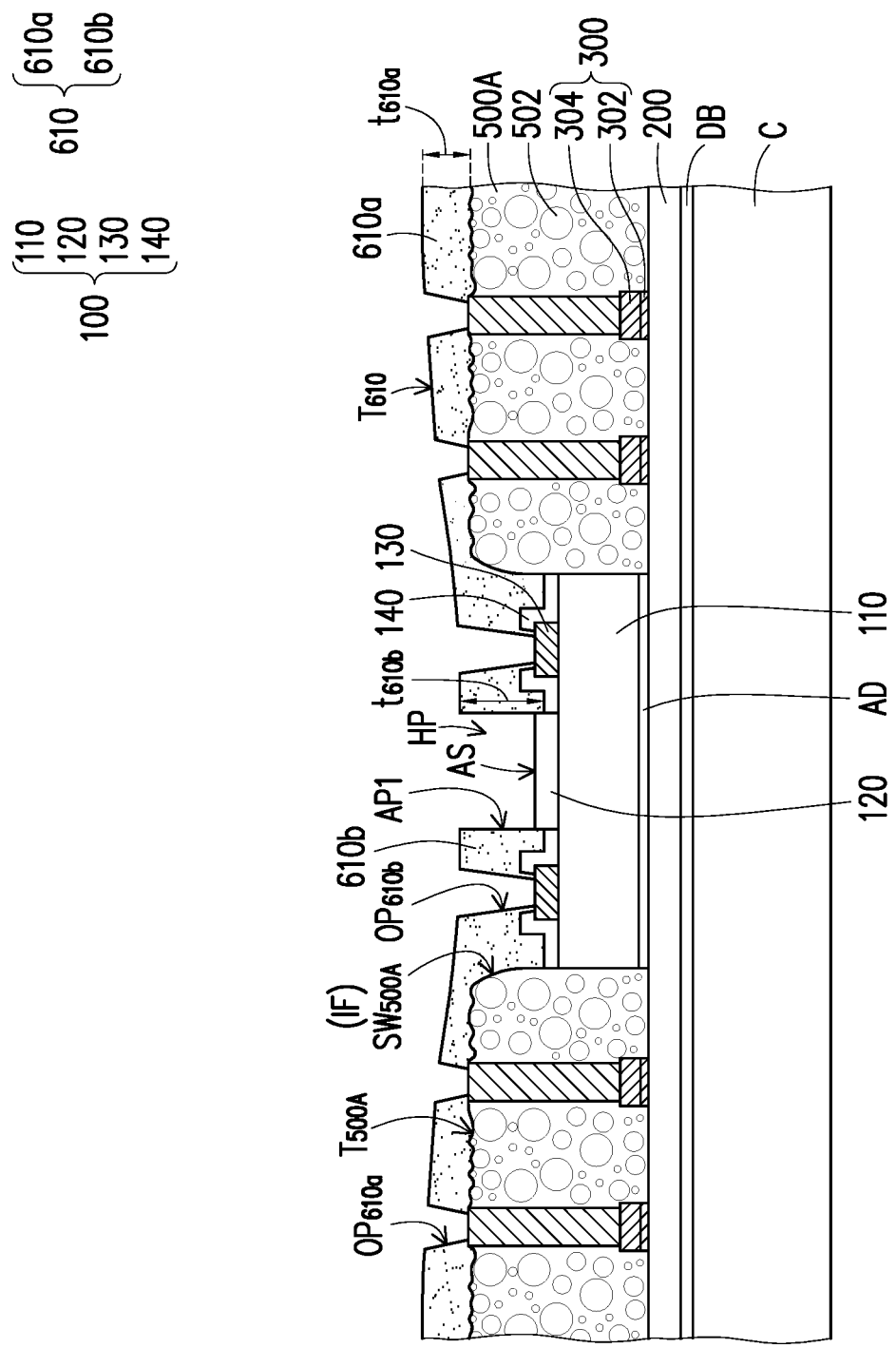
Figure 2G:
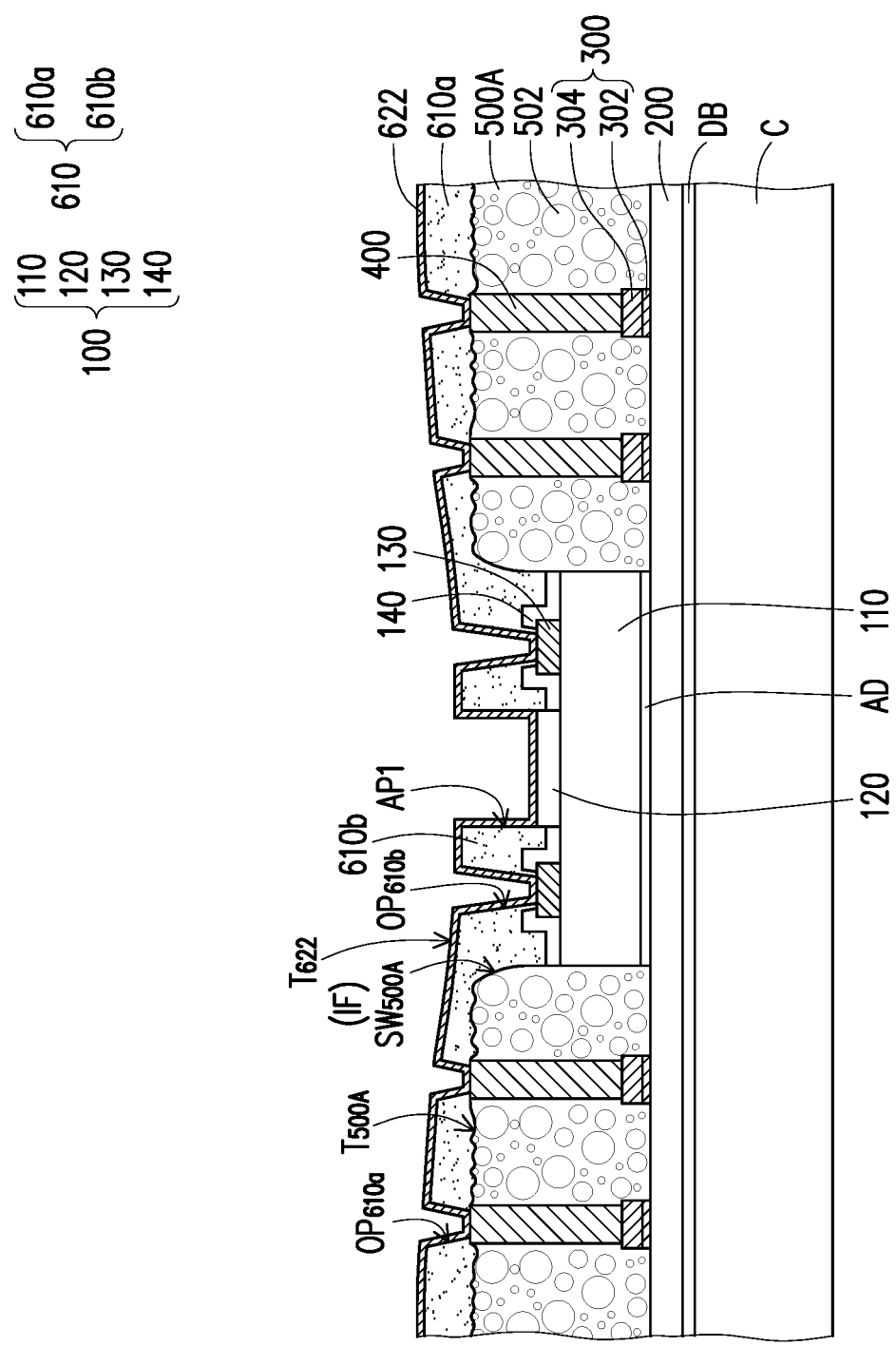
Figure 2H:
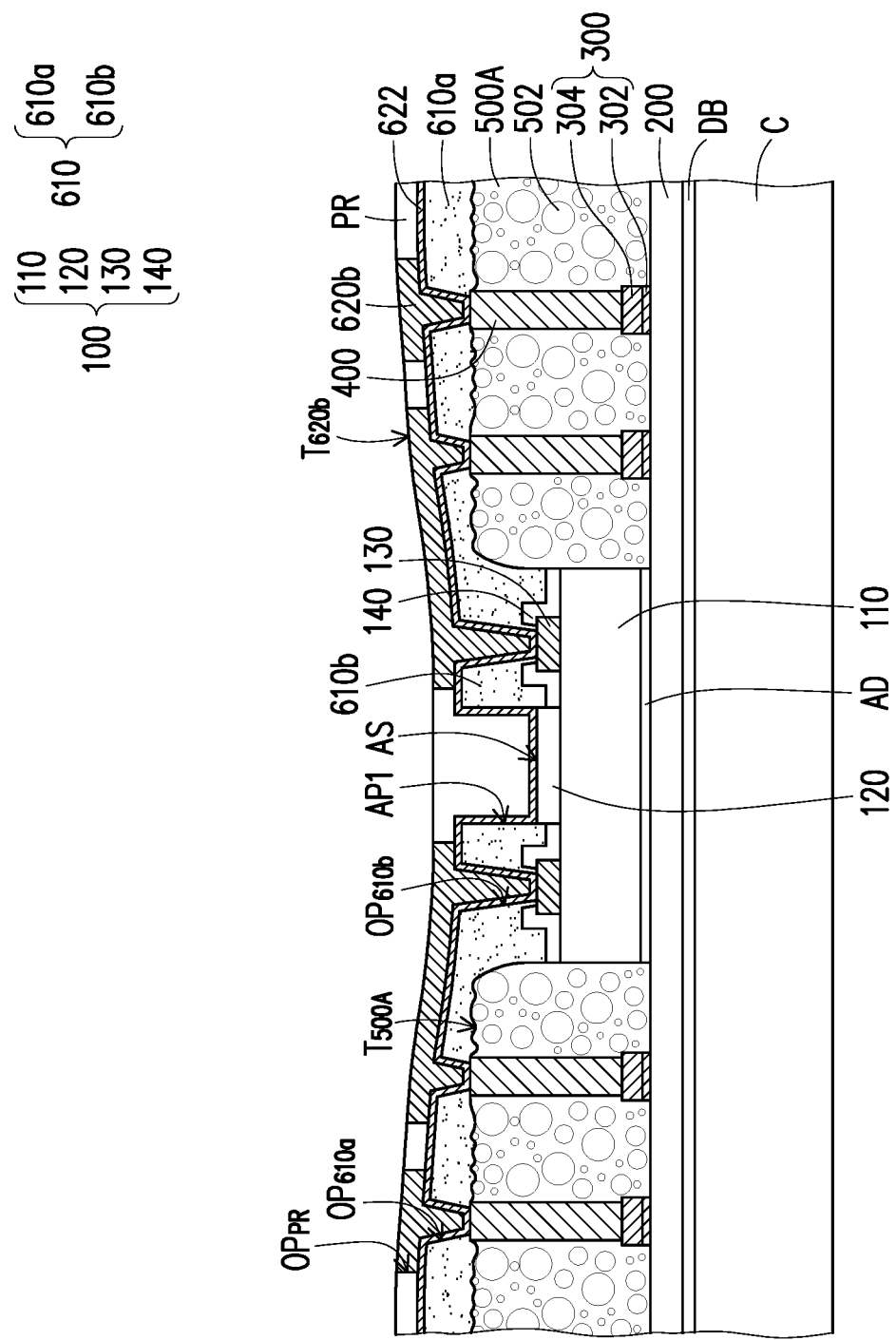
Figure 2I:
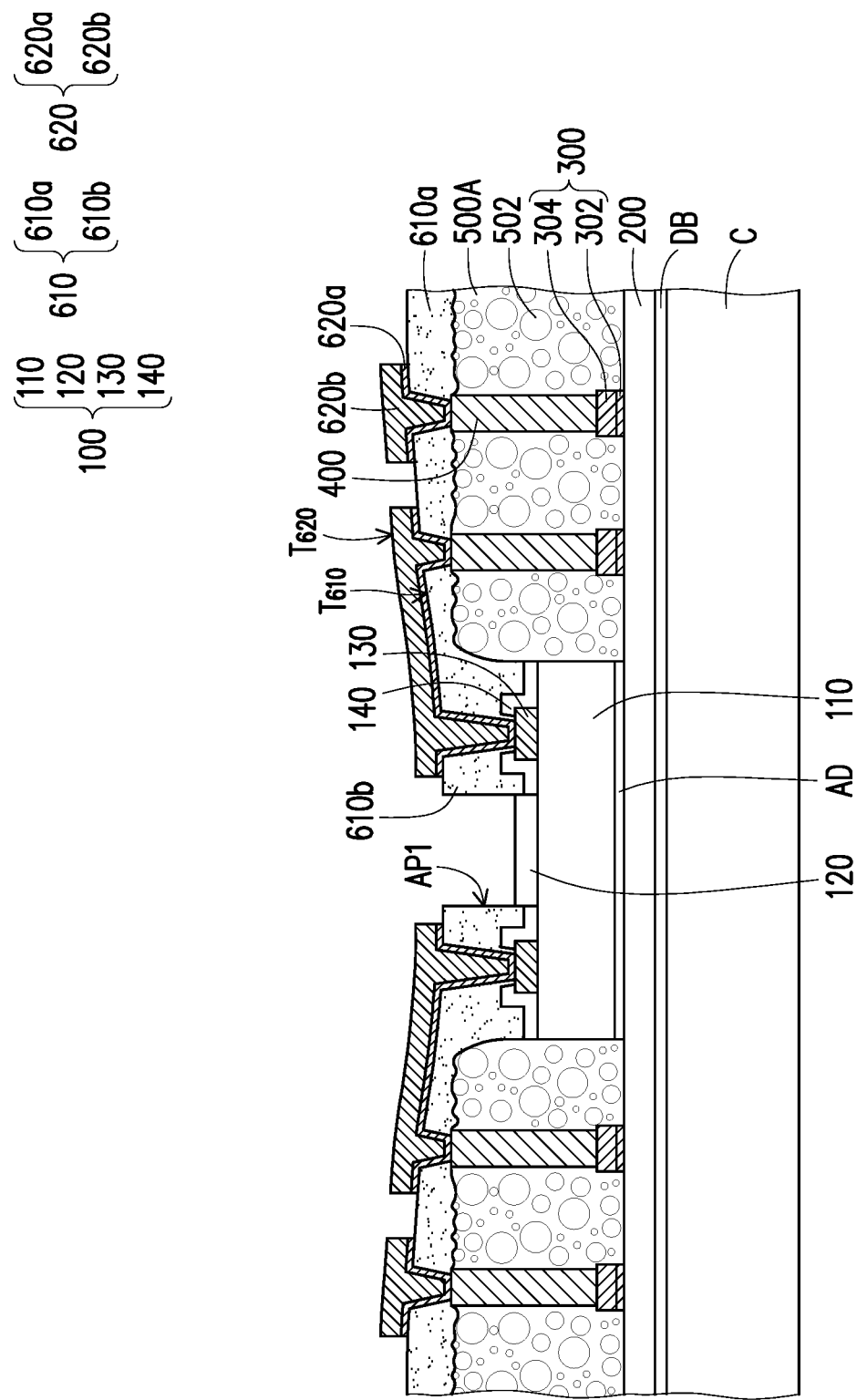
Figure 2J:
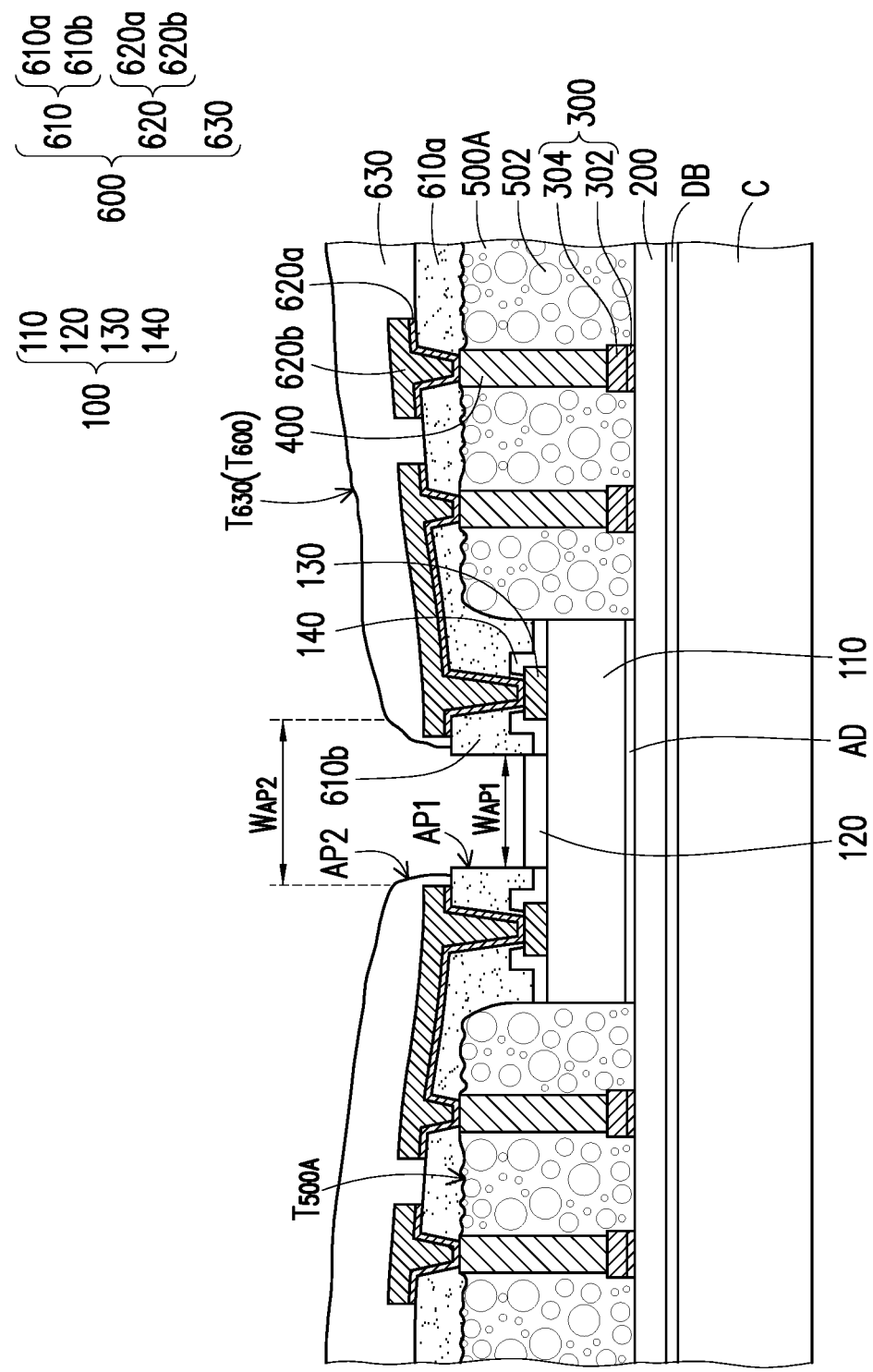
Figure 2K:
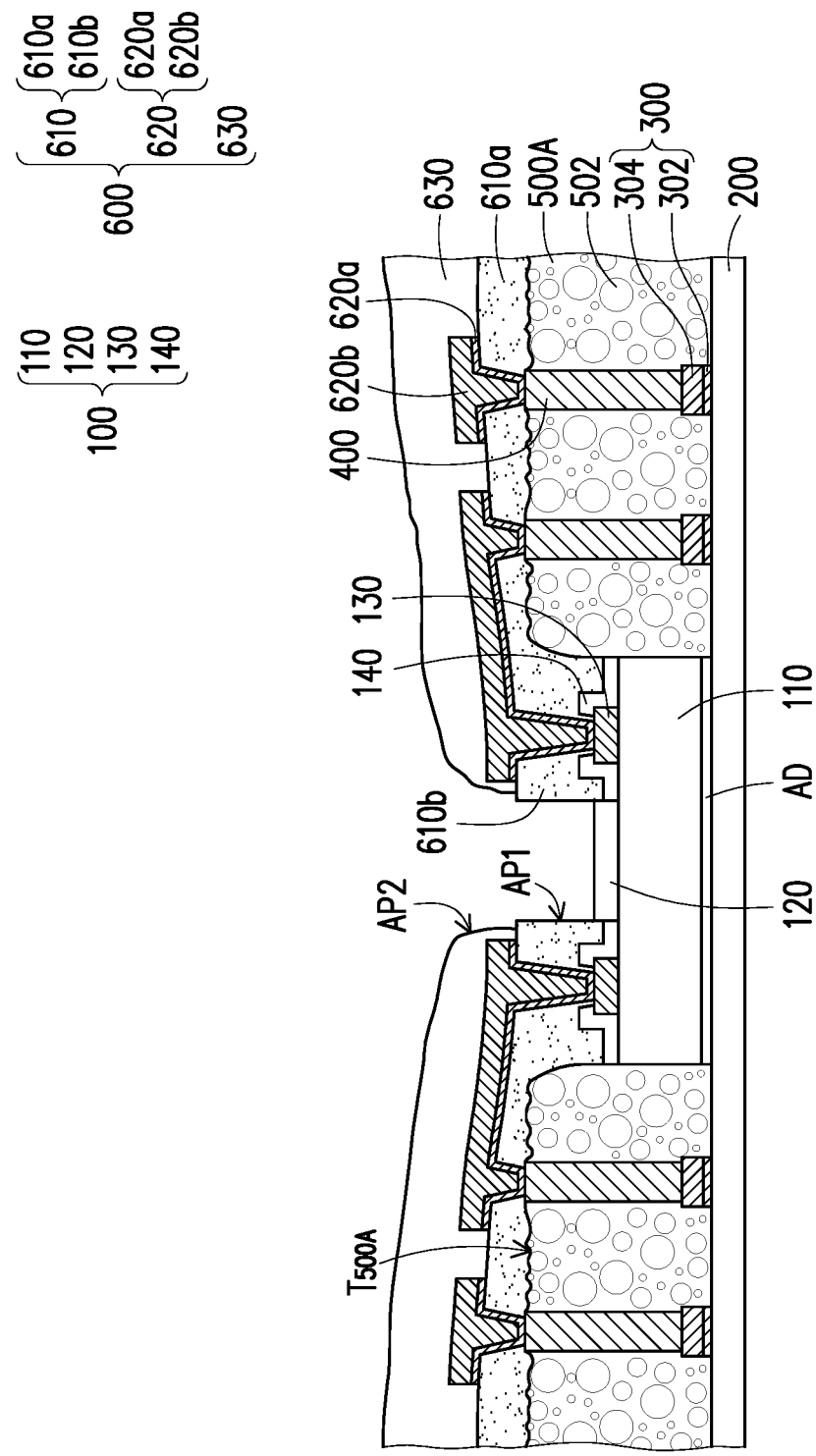
Figure 2L:
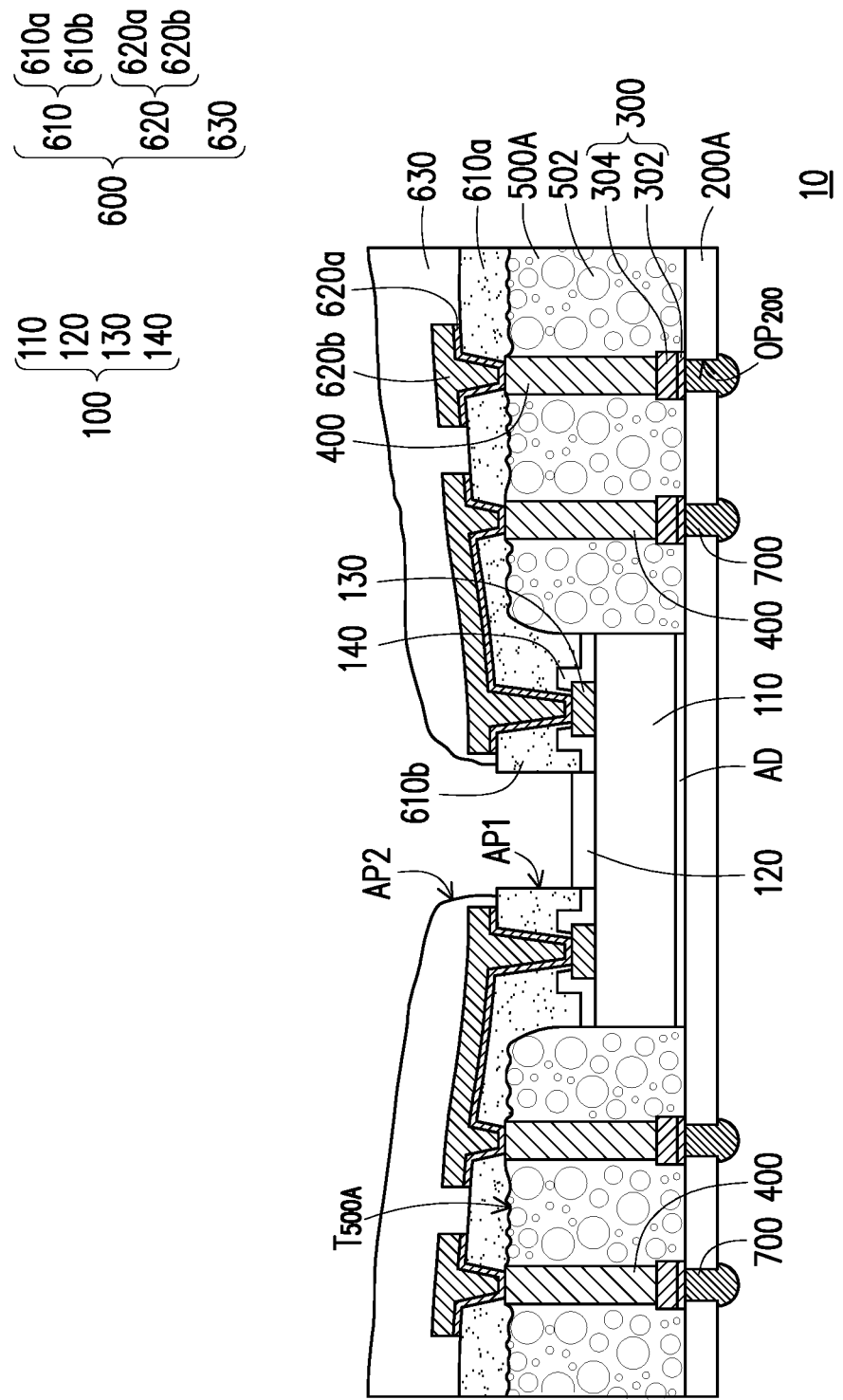
Figure 3:
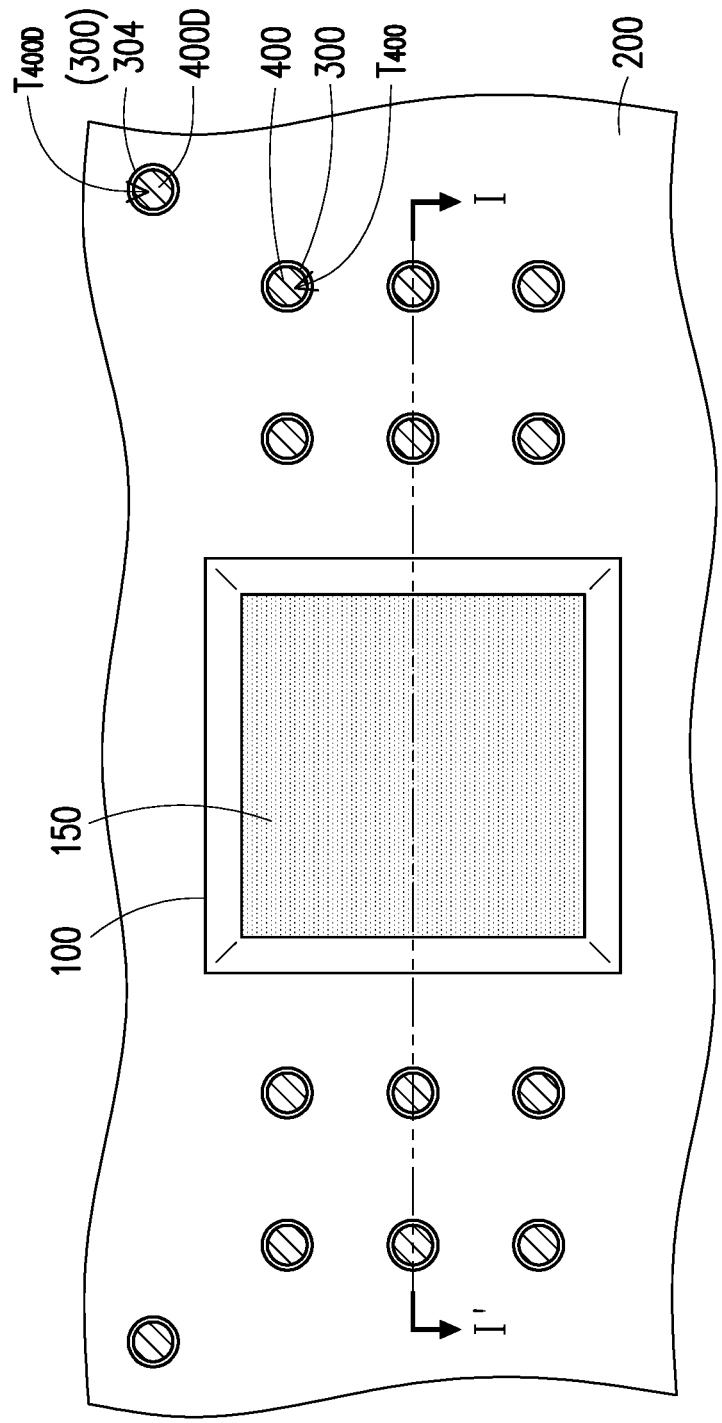
FIG. 3 is a schematic top view of FIG. 2B in accordance with some embodiments.
Figure 4A:
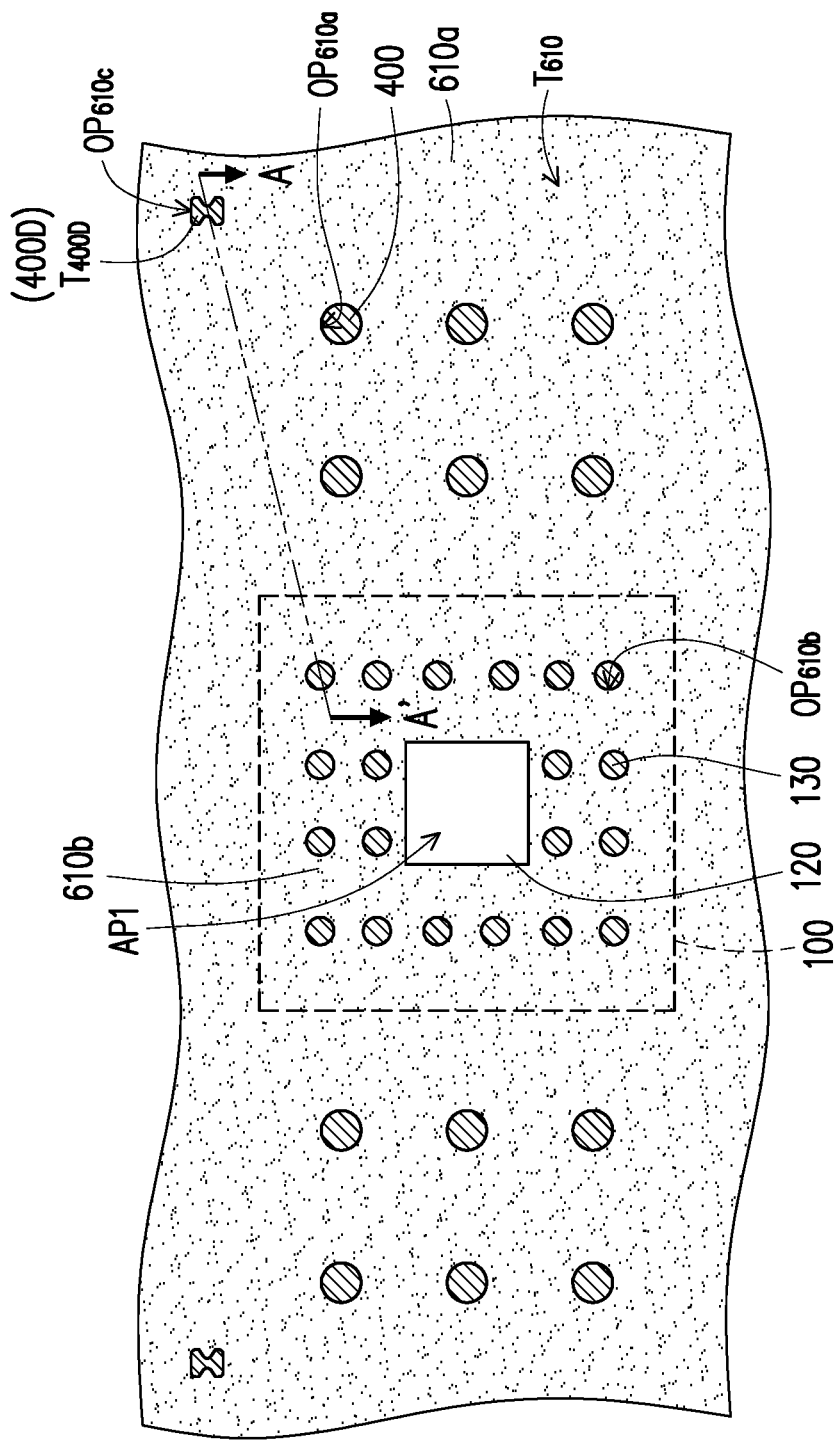
FIG. 4A is a schematic top view of FIG. 2F in accordance with some embodiments.
Figures 5A, 5B, 6:
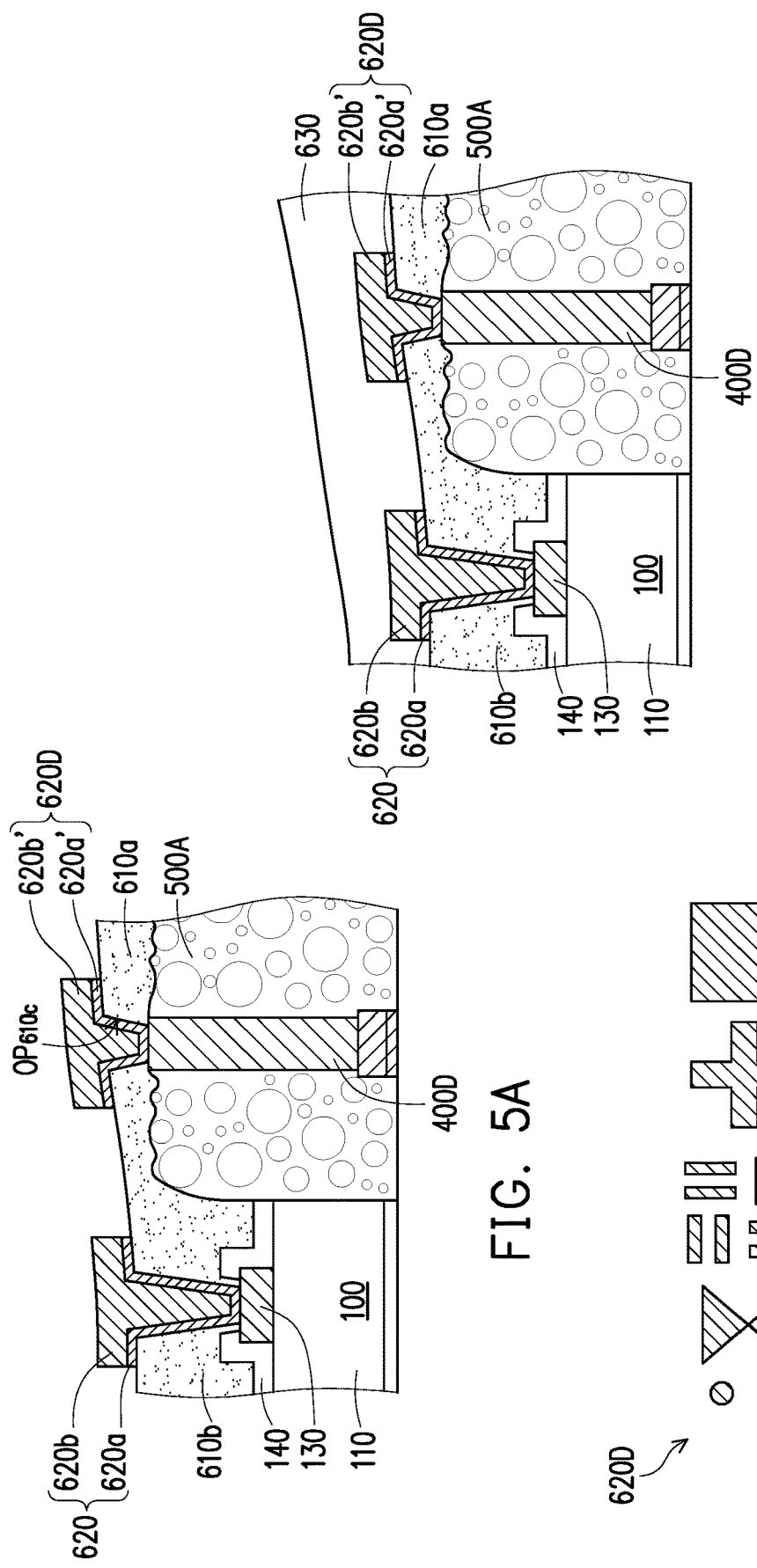
FIG. 5A is a schematic cross-sectional view illustrating conductive patterns and dummy conductive patterns formed on the structure shown in FIG. 4B in accordance with some embodiments.
FIG. 5B illustrates different shapes of dummy conductive patterns in accordance with some embodiments.
FIG. 6 is a schematic cross-sectional view illustrating a second patterned dielectric layer formed on the structure shown in FIG. 5A in accordance with some embodiments.

FIGS. 2A-2L are schematic cross-sectional views of various stages of manufacturing a semiconductor package in accordance with some embodiments, FIG. 3 is a schematic top view of FIG. 2B in accordance with some embodiments, FIG. 4A is a schematic top view of FIG. 2F in accordance with some embodiments, FIG. 4B is a schematic cross-sectional view illustrating partial structure taken along line A-A' in FIG. 4A in accordance with some embodiments, FIG. 4C illustrates different shapes of alignment openings in accordance with some embodiments, FIG. 5A is a schematic cross-sectional view illustrating conductive patterns and dummy conductive patterns formed on the structure shown in FIG. 4B in accordance with some embodiments, FIG. 5B illustrates different shapes of dummy conductive patterns in accordance with some embodiments, and FIG. 6 is a schematic cross-sectional view illustrating a second patterned dielectric layer formed on the structure shown in FIG. 5A in accordance with some embodiments.

Referring to FIG. 2A, a carrier substrate C with a de-bonding layer DB and a dielectric layer 200 formed thereon is provided. In some embodiments, the de-bonding layer DB is formed on a top surface of the carrier substrate C, and the de-bonding layer DB is interposed between the carrier substrate C and the dielectric layer 200. For example, the carrier substrate C may be a glass substrate and the de-bonding layer DB may be a light-to-heat conversion (LTHC) release layer formed on the glass substrate. However, the disclosure is not limited thereto. Other suitable materials may be adapted for the carrier substrate C and the de-bonding layer DB. In some embodiments, a material of the dielectric layer 200 includes polyimide, epoxy resin, acrylic resin, BCB, PBO, or any other suitable polymer-based dielectric material. The dielectric layer 200, for example, may be formed by suitable fabrication techniques such as spin-on coating, CVD, PECVD, or the like.

Continue to FIG. 2A, a plurality of seed layer patterns 302 and a plurality of conductive material patterns 304 are sequentially formed over the dielectric layer 200. In some embodiments, the seed layer patterns 302 and the conductive material patterns 304 are formed by the following steps. A seed material layer (not shown) is blanketly and conformally formed over the dielectric layer 200. In some embodiments, the seed material layer is a composite layer formed by different materials. For example, the seed material layer may be a Ti/Cu bilayer, a copper layer, or other suitable metal layer, and may be deposited using thin-film deposition such as physical vapor deposition (PVD), e.g., sputtering, evaporation, or other applicable methods. After the seed material layer is formed over the dielectric layer 200, a mask layer (not shown) is formed on the seed material layer. The mask layer has openings partially exposing the seed material layer. For example, the mask layer may be or may include a photoresist or a dry film.

Next, a conductive material layer (not shown; e.g., copper, copper alloys, or the like) is filled into the openings of the mask layer. For example, the conductive material layer is formed on the portion of the seed material layer exposed by the openings of the mask layer. In some embodiments, the conductive material layer may be formed by a plating process (e.g., electro-plating, electroless-plating, immersion plating, or the like). A grinding process (e.g., mechanical grinding process, a chemical mechanical polishing (CMP) process, etc.) is optionally performed after plating. However, the disclosure is not limited thereto. Subsequently, the mask layer is removed through a stripping process, an etching process, and/or a cleaning process. Upon removal of the mask layer, a portion of the seed material layer is exposed. For example, the seed material layer not covered by the conductive material layer is exposed. Then, the exposed portion of the seed material layer may be removed through an etching process to form the seed layer patterns 302 and the conductive material patterns 304. In some embodiments, sidewalls of each seed layer pattern 302 are aligned with sidewalls of the corresponding conductive material pattern 304. In some embodiments, the seed layer patterns 302 and the conductive material patterns 304 may be collectively referred to as a redistribution structure 300.

Although the redistribution structure 300 is illustrated as having one layer of seed layer patterns 302 and one layer of conductive material patterns 304, the disclosure is not limited thereto. In some alternative embodiments, multiple layers of seed layer patterns 302 and multiple layers of conductive material patterns 304 may exist in the redistribution structure 300. Under this scenario, the redistribution structure 300 may further include a plurality of dielectric layers alternately stacked with the seed layer patterns 302 and the conductive material patterns 304.

Referring to FIG. 2B, the semiconductor die 100 shown in FIG. 1D is disposed over the carrier substrate C. For example, the semiconductor die 100 is picked-and-placed onto the dielectric layer 200. In some embodiments, the semiconductor die 100 is attached to the dielectric layer 200 through an adhesive layer AD. In some embodiments, the rear surface RS of the semiconductor die 100 is attached to the adhesive layer AD when fabricating the semiconductor dies 100. The adhesive layer AD may include a die attach film (DAF) or other suitable adhering material. For simplicity, one semiconductor die 100 is shown in FIG. 2B. However, it should be understood that multiple semiconductor dies 100 may be placed over the carrier substrate C to arrange in an array.

Continue to FIG. 2B and also with reference to FIG. 3, a plurality of through insulator vias (TIV) 400 and at least one dummy TIV 400D may be formed over redistribution structure 300. In some embodiments, the TIVs 400 surround the semiconductor die 100. Compared to the TIVs 400, which are electrically connected to the semiconductor die 100 via the subsequently formed conductive patterns, the dummy TIV 400D may not be in electrical communication with the semiconductor die 100 in the resulting semiconductor package. In some embodiments, the dummy TIV 400D is located in a region selected to control alignment during the subsequent patterning process. For example, the dummy TIV 400D is disposed in the border region (or corner region) of the resulting semiconductor package. In some embodiments, a plurality of dummy TIVs 400D is formed to promote pattern density uniformity, thereby alleviating the adverse effects associated with the dishing effect. In some alternative embodiments, the dummy TIV 400D is omitted. It is noted that the cross sectional views of FIGS. 2B-2C may be taken along line I-I' in FIG. 3, so that the dummy TIVs 400D are not shown in these cross sectional views.

For example, the TIVs 400 and the dummy TIVs 400D are directly in contact with the conductive material patterns 304. The material of the TIVs 400 and/or the dummy TIVs 400D may include copper, copper alloys, or the like. For example, the TIVs 400, the dummy TIVs 400D, and the conductive material patterns 304 may be made of the same material. Alternatively, the TIVs 400, the dummy TIVs 400D, and/or the conductive material patterns 304 may be made of different materials. In some embodiments, the TIVs 400 and the dummy TIVs 400D are formed on the redistribution structure 300 through a plating process. For example, a seed layer (not shown) is first formed on top surfaces of the conductive material patterns 304. Thereafter, the TIVs 400 and the dummy TIVs 400D are plated onto the seed layer over the top surfaces of the conductive material patterns 304. However, the disclosure is not limited thereto. In some alternative embodiments, the TIVs 400 and the dummy TIVs 400D are plated onto top surfaces of the conductive material patterns 304 while utilizing the seed layer patterns 302 as the seed layer. Under this scenario, the exposed portion of the seed material layer discussed in FIG. 2A is not removed prior to the formation of TIVs 400 and the dummy TIVs 400D. That is, the TIVs 400 and the dummy TIVs 400D may be plated by utilizing the seed material layer discussed in FIG. 2A as a seed layer. After the TIVs 400 and the dummy TIVs 400D are formed, the exposed portion of the seed material layer is removed to form the seed layer patterns 302. In some embodiments, the plating process includes, electro-plating, electroless-plating, immersion plating, or the like. However, the disclosure is not limited thereto.

In some alternative embodiments, the TIVs 400 and/or the dummy TIVs 400D may be formed by pick and place pre-fabricated conductive pillars onto the conductive material patterns 304. In some embodiments, a width/diameter of each TIV 400 and each dummy TIV 400D is smaller than a width of the conductive material patterns 304. In some alternative embodiments, the width/diameter of each TIV 400 may be substantially the same as the width of the conductive material patterns 304. In some embodiments, the sizes of the dummy TIV 400D and the TIV 400 are substantially the same. However, the disclosure is not limited thereto. The size of the dummy TIV 400D may be greater or smaller than the size of the TIV 400. In some embodiments, the TIVs 400 are formed prior to the placement of the semiconductor die 100. However, the disclosure is not limited thereto. In some alternative embodiments, the placement of the semiconductor die 100 may precede the formation of TIVs 400. It is noted that the shapes, the numbers, and the configurations of the TIVs 400, the dummy TIVs 400D, and the semiconductor die 100 shown in FIG. 3 are merely examples, and the disclosure is not limited thereto.

Referring to FIG. 2C, an encapsulation material 500a is formed over the dielectric layer 200 to encapsulate the semiconductor die 100, the redistribution structure 300, the adhesive layer AD, the TIVs 400, and the dummy TIVs 400D (shown in FIG. 3). In some embodiments, the encapsulation material 500a is a molding compound, a molding underfill, a resin (e.g., epoxy), or the like. In some alternative embodiments, the encapsulation material 500a includes a photosensitive material such as PBO, polyimide, BCB, a combination thereof, or the like. In some embodiments, the encapsulation material 500a is formed by a molding process, such as a compression molding process. In some embodiments, the encapsulation material 500a includes fillers 502 which are pre-mixed into insulating base material before they are applied. For example, the fillers 502 include particles of $Al_2O_3$, $SiO_2$, $TiO_2$, and/or the like. In some embodiments, a diameter of the fillers 502 may be in a range of about 0.1 μm to about 100 μm. In other embodiments, the encapsulation material 500a is free of filler. In some embodiments, the semiconductor die 100, the TIVs 400, and the dummy TIVs 400D (shown in FIG. 3) are over-molded and are well protected by the encapsulation material 500a. For example, a top surface $T_{500a}$ of the encapsulation material 500a is located at a level height higher than a top surface $T_{100}$ of the semiconductor die 100 and top surfaces $T_{400}$ of the TIVs 400.

Referring to FIG. 2D and with reference to FIG. 2C, the thickness of the encapsulation material 500a is reduced until the top surface $T_{100}$ of the semiconductor die 100 and the top surfaces $T_{400}$ of the TIVs 400 are both exposed. In some embodiments, the encapsulation material 500a is ground until the sacrificial film 150 and the TIVs 400 are exposed. In some embodiments, after reducing the thickness of the encapsulation material 500a, the dummy TIVs 400D (shown in FIG. 3) are also accessibly revealed. After the encapsulation material 500a is ground, an encapsulant 500 is formed over the dielectric layer 200 to laterally encapsulate the semiconductor die 100, the adhesive layer AD, the redistribution structure 300, and the TIVs 400. In some embodiments, the encapsulation material 500a is ground by a mechanical grinding process and/or a CMP process.

In some embodiments, after the top surface $T_{100}$ of the semiconductor die 100 and the top surfaces $T_{400}$ of the TIVs 400 are reveled, the grinding process may continue such that portions of the sacrificial film 150 and portions of the TIVs 400 are ground as well. The sacrificial film 150 may provide a certain degree of protection for the elements covered therein when the grinding process is performed. In some embodiments, the dummy TIVs 400D may alleviate a loading effect in the polishing process (e.g., a CMP process). In some embodiments, after the grinding process, a top surface $T_{500}$ of the encapsulant 500 is substantially leveled with the top surface $T_{100}$ of the semiconductor die 100 and the top surfaces $T_{400}$ of the TIVs 400. The top surfaces $T_{400}$ of the TIVs 400 may be substantially leveled with the top surfaces of the dummy TIVs 400D (shown in FIG. 3). The encapsulant 500 may extend along the sidewalls of the semiconductor die 100, the TIVs 400, and the dummy TIVs 400D. In some embodiments, after the grinding process, the curved sidewalls $SW_{150}$ of the sacrificial film 150 of the semiconductor die 100 is conformally covered by the encapsulant 500.

Referring to FIG. 2E and with reference to FIG. 2D, the sacrificial film 150 of the semiconductor die 100 is removed to form a hollow portion HP, and the active surface AS of the semiconductor die 100 is exposed to the hollow portion HP. In some embodiments, the sacrificial film 150 is removed through an etch process, (e.g., a dry etch process) or other suitable removal techniques. In some embodiments, after removal of the sacrificial film 150, a thickness $t_{100}$ of the semiconductor die 100 is less than a thickness $t_{500A}$ of the etched encapsulant 500A. In some embodiments, when removing the sacrificial film 150, a portion of the encapsulant 500 is also etched to form an etched encapsulant 500A. For example, when removing the sacrificial film 150, a portion EP of the encapsulant 500 that covers the curved sidewalls $SW_{150}$ of the sacrificial film 150 is removed together with the sacrificial film 150. It is noted that the portion EP is shown in phantom to indicate that the portion EP is removed after the removal step.

For example, the removal step may leave the etched encapsulant 500A with upper inner sidewalls $SW_{500A}$ that are angled (while still retaining lower vertical sidewalls that are in contact with the sidewalls $SW_{110}$ of the semiconductor substrate 110). In some embodiments, the upper inner sidewalls $SW_{500A}$ include rounded corners that are connected to the lower vertical sidewalls and the top surface $T_{500A}$. In some embodiments, at least a portion of the upper inner sidewalls $SW_{500A}$ of the etched encapsulant 500A is in a curved shape. For example, a concave-down surface profile may be seen from the cross-sectional view as shown in FIG. 2E. In some embodiments, the upper inner sidewalls $SW_{500A}$ having the concave-down surface profile is referred to as a curved portion CP. In some embodiments, the curved portion CP of the upper inner sidewalls $SW_{500A}$ may render the hollow portion HP tapering in width from wide to narrow in a direction from the top surface $T_{500A}$ toward the active surface AS of the semiconductor die 100. As illustrated in FIG. 2E, a top width $W_{HP}$ of the hollow portion HP is greater than a width $W_{100}$ of the semiconductor die 100.

In some embodiments, during the removal step, the fillers 502 on the top of the encapsulant 500 are also removed, thereby causing the top surface $T_{500A}$ of the etched encapsulant 500A uneven. As surface roughness is known that provides a measure of the unevenness of the surface height. The surface roughness of the top surface $T_{500A}$ of the etched encapsulant 500A may be greater than that of the top surfaces $T_{400}$ of the TIVs 400 after the removal step. In some embodiments, the surface roughness of the top surface $T_{500A}$ of the etched encapsulant 500A is also greater than the top surfaces $T_{400D}$ of the dummy TIVs 400D (shown in FIGS. 3 and 4A). In some embodiments, the average surface roughness of the top surface $T_{500A}$ of the etched encapsulant 500A is in the range of about 0.1 μm to about 10 μm. It should be appreciated that the illustration of the etched encapsulant 500A is schematic and is not in scale.

Referring to FIG. 2F and also with reference to FIGS. 2E and 4A, a first patterned dielectric layer 610 is formed on the semiconductor die 100, the etched encapsulant 500A, the TIVs 400, and the dummy TIVs 400D. The first patterned dielectric layer 610 may include a first portion 610a and a second portion 610b connected to the first portion 610a. The first portion 610a may be formed on the TIVs 400, the dummy TIVs 400D, and the etched encapsulant 500A. The second portion 610b of the first patterned dielectric layer 610 may be formed in the hollow portion HP to partially cover the semiconductor die 100.

For example, the first portion 610a of the first patterned dielectric layer 610 is in physical contact with the TIVs 400, the dummy TIVs 400D, and the etched encapsulant 500A. The second portion 610b of the first patterned dielectric layer 610 may be in physical contact with the active surface AS of the semiconductor die 100. In some embodiments, the first portion 610a of the first patterned dielectric layer 610 has a plurality of openings $OP_{610a}$ and $OP_{610c}$. The second portion 610b of the first patterned dielectric layer 610 may include a plurality of openings $OP_{610b}$ and a first aperture AP1. In some embodiments, the openings $OP_{610a}$ accessibly expose at least a portion of each TIV 400, and the openings $OP_{610c}$ accessibly expose at least a portion of each dummy TIV 400D. In some embodiments, a portion of the second portion 610b extends into the openings of the patterned passivation layer 140 to be in physical contact with the respective conductive pad 130. In some other embodiments, the inner sidewalls of the second portion 610b that define the openings $OP_{610b}$ are substantially aligned with the inner sidewalls of the patterned passivation layer 140 that define the openings of the patterned passivation layer 140 exposing the conductive pads 130. The openings $OP_{610b}$ may accessibly expose at least a portion of each conductive pad 130 of the semiconductor die 100. The first aperture AP1 may accessibly expose the sensing component 120 of the semiconductor die 100.

In some embodiments, the first patterned dielectric layer 610 is formed by forming a layer of dielectric material and removing a portion of the dielectric material to form the openings ($OP_{610a}$, $OP_{610b}$, and $OP_{610c}$) and the first aperture AP1. The step of forming the layer of dielectric material may include any suitable fabrication techniques such as spin-on coating, CVD, PECVD, or the like. The step of removing the portion of the dielectric material may include lithography process and an etching process, or other suitable techniques. In some embodiments, a material of the first patterned dielectric layer 610 includes polyimide, epoxy resin, acrylic resin, phenol resin, BCB, PBO, or any other suitable polymer-based dielectric material.

As illustrated in FIG. 2F, the first patterned dielectric layer 610 covers the top surface $T_{500A}$ and the upper inner sidewalls $SW_{500A}$ of the etched encapsulant 500A. Since the first patterned dielectric layer 610 fills into the hollow portion HP, an interface IF between the upper inner sidewalls $SW_{500A}$ of the etched encapsulant 500A and the first patterned dielectric layer 610 may follow the contour of the upper inner sidewalls $SW_{500A}$ of the etched encapsulant 500A. For example, the interface IF between the upper inner sidewalls $SW_{500A}$ of the etched encapsulant 500A and the first patterned dielectric layer 610 is curved. In some embodiments, the existence of the hollow portion HP causes the top surface $T_{610}$ of the first patterned dielectric layer 610 uneven. In some embodiments, the surface roughness of the top surface $T_{610}$ of the first patterned dielectric layer 610 is less than the surface roughness of the top surface $T_{500A}$ of the etched encapsulant 500A. For example, the average surface roughness of the top surface $T_{610}$ of the first patterned dielectric layer 610 is in the range of about 0.01 μm to about 2 μm.

In some embodiments, a maximum thickness $t_{610a}$ of the first portion 610a of the first patterned dielectric layer 610 is less than a maximum thickness $t_{610b}$ of the second portion 610b of the first patterned dielectric layer 610. In some embodiments, the thickness of the first portion 610a of the first patterned dielectric layer 610 increases in a direction from the point intersecting the upper inner sidewalls $SW_{500A}$ of the etched encapsulant 500A and the top surface $T_{500A}$ of the etched encapsulant 500A to the point distal from the upper inner sidewalls $SW_{500A}$ of the etched encapsulant 500A. For example, the top surface $T_{610}$ of the first patterned dielectric layer 610 is sloped toward the region that corresponds to the semiconductor die 100. In some embodiments, the top surface $T_{610}$ of the first patterned dielectric layer 610 forms a ramp toward the point directly above the center of the semiconductor die 100. In some embodiments, the top surface $T_{610}$ of the first patterned dielectric layer 610 has a slope ranging between about 0 degrees to about 60 degrees. It is noted that the slope of the top surface $T_{610}$ may change depending on the thickness of the first patterned dielectric layer 610. For example, the increase of thickness of the first patterned dielectric layer 610 may render the gentler slanting top surface $T_{610}$.

With continued reference to FIG. 2F and further referencing FIGS. 4A-4C, the shape of the openings $OP_{610c}$ partially exposing the dummy TIVs 400D may be designed to serve as alignment marks (or alignment openings) for the subsequent patterning process. As discussed above, the surface roughness of the top surface $T_{500A}$ of the etched encapsulant 500A is greater than that of the top surfaces $T_{400D}$ of the dummy TIVs 400D. Compared to the openings $OP_{610c}$ formed to expose the dummy TIVs 400D, the openings (not shown) exposing the top surface $T_{500A}$ of the etched encapsulant 500A may suffer from asymmetrical boundary or topography due to rougher top surface $T_{500A}$, which may cause image blurs in alignment. In other words, forming the alignment openings (i.e. the openings $OP_{610c}$) to expose the top surfaces $T_{400D}$ of the dummy TIVs 400D may provide improved alignment control for forming subsequent features of the semiconductor package, compared to the openings formed to expose the top surface $T_{500A}$ of the etched encapsulant 500A.

In some embodiments, as shown in FIG. 4C, the openings $OP_{610c}$ include distinguishable patterns having such as a discrete-circular shape, an hourglass shape, a crossed shape, a rounded-square shape, a combination of these, etc. It is appreciated that the openings $OP_{610c}$ may have any shape or pattern, as long as they can be identified during the subsequent processing. In some embodiments, the dimension of the respective alignment opening (i.e. the opening $OP_{610c}$) may range from about 1 μm to about 100 μm. In some embodiments in which the alignment opening is of a discrete-circular shape, the dimension of the alignment opening may be referred to as the diameter D1 of any one of the circular openings. In some embodiments where the alignment opening is of an hourglass shape, the dimension of the alignment opening may be referred to as the maximum width D2 of the top portion, the maximum width D2 of the neck portion, or the maximum width D2 of the bottom portion. In some embodiments where the opening $OP_{610c}$ is of the cross-shaped alignment mark, the dimension may be referred to as the maximum width D3 of one of the strips. In some embodiments where the opening $OP_{610c}$ is of the rounded-square alignment mark, the dimension may be referred to as the maximum width D4 of the rounded-square. It should be appreciated that the shape, the number, and the size of the alignment openings illustrated in FIGS. 4A-4C are merely examples, and the disclosure is not limited thereto.

Referring to FIG. 2G and also with reference to FIG. 4A, a seed material layer 622 is conformally formed over the first patterned dielectric layer 610. For example, the seed material layer 622 extends into the openings ($OP_{610a}$, $OP_{610b}$, and $OP_{610c}$) and the first aperture AP1 to be in direct contact with the TIVs 400, the dummy TIVs 400D, the conductive pads 130, and the sensing components 120. In some embodiments, the seed material layer 622 is a composite layer formed by different materials. For example, the seed material layer 622 includes two sub-layers (not shown). The first sub-layer may include titanium, titanium nitride, tantalum, tantalum nitride, other suitable materials, or a combination thereof. The second sub-layer may include copper, copper alloys, or other suitable choice of materials. In some embodiments, the seed material layer 622 is formed by PVD, sputtering, or other application methods. In some embodiments, the seed material layer 622 follows the profile of the underlying first patterned dielectric layer 610. In other words, a portion of a top surface $T_{622}$ of the seed material layer 622 corresponding to the upper inner sidewalls $SW_{500A}$ of the etched encapsulant 500A is slanted.

Referring to FIG. 2H, a photoresist layer PR is formed on the seed material layer 622. In some embodiments, the photoresist layer PR has a plurality of openings $OP_{PR}$. The openings $OP_{PR}$ may accessibly expose the underlying seed material layer 622. For example, the openings $OP_{PR}$ accessibly expose portions of the seed material layer 622, that are located inside the openings ($OP_{610a}$, $OP_{610b}$, and $OP_{610c}$), and the openings $OP_{PR}$ may also accessibly expose the seed material layer 622 in proximity of the openings ($OP_{610a}$, $OP_{610b}$, and $OP_{610c}$). In some embodiments, the photoresist layer PR covers the first aperture AP1.

In some embodiments, the step of forming the openings $OP_{PR}$ includes resist coating (e.g., spin-on coating), soft baking, mask aligning, exposure, post-exposure baking, developing the resist, rinsing, hard baking, other suitable processes, and/or combinations thereof. Alternatively, the lithography process is implemented or replaced by other proper methods such as mask-less lithography, electron-beam writing, direct-writing, and/or ion-beam writing. In some embodiments, during the step of forming the openings $OP_{PR}$, the openings $OP_{610c}$ (shown in FIG. 4B) partially exposing the dummy TIVs 400D may serve as alignment marks for mask aligning. Since the openings $OP_{610c}$ exposing the top surfaces $T_{400D}$ of the dummy TIVs 400D may form a clear pattern for alignment, the photomask (not shown) for forming the openings $OP_{PR}$ of the photoresist layer PR may be properly positioned. The more accurate the photomask is positioned, the better the alignment between the subsequently formed conductive patterns 620 and the underlying conductive pads 130 (or the underlying TIVs 400).

Continue to FIG. 2H, a plurality of conductive material patterns 620b is formed on the seed material layer 622 and in the openings $OP_{PR}$. In some embodiments, a material of the conductive material patterns 620b includes aluminum, titanium, copper, nickel, tungsten, and/or alloys thereof. In some embodiments, the conductive material patterns 620b are formed through electro-plating, electroless-plating, immersion plating, or the like. In some embodiments, the conductive material patterns 620b may follow the profiles of the top surfaces of the underlying first patterned dielectric layer 610 and the seed material layer 622. For example, top surfaces $T_{620b}$ of the conductive material patterns 620b are slanted in a direction from the top surface $T_{500A}$ of the etched encapsulant 500A towards the active surface AS of the semiconductor die 100. In some embodiments, the top surfaces $T_{620b}$ of the conductive material patterns 620b form ramps toward the point directly above the center of the semiconductor die 100.

Referring to FIG. 2I and with reference to FIG. 2H, the photoresist layer PR is removed. In some embodiments, the photoresist layer PR is removed through a stripping process, an etching process, a cleaning process, a combination thereof, or the like. Next, the seed material layer 622 exposed by the conductive material patterns 620b is removed to form a plurality of seed layer patterns 620a underneath the conductive material patterns 620b. In some embodiments, the exposed portion of the seed material layer 622 is removed through an etching process. In some embodiments, since the photoresist layer PR is being removed sufficiently, the conductive material patterns 620b may serve as a mask for removing the portion of the seed material layer 622 unmasked by the conductive material patterns 620b.

In some embodiments, the contours of the seed layer patterns 620a are substantially identical to the contours of the conductive material patterns 620b overlying the seed layer patterns 620a. For example, the sidewalls of each seed layer pattern 620a are aligned with sidewalls of the corresponding conductive material pattern 620b. In some embodiments, the seed layer patterns 620a and the conductive material patterns 620b are collectively referred to as conductive patterns 620. In some embodiments, the conductive patterns 620 formed on the first patterned dielectric layer 610 may be referred to as a redistribution circuitry. For example, the conductive patterns 620 are in physical and electrical contact with the conductive pads 130 of the semiconductor die 100 and the TIVs 400. The conductive patterns 620 may follow the profile of the top surface $T_{610}$ of the underlying first patterned dielectric layer 610. For example, top surfaces $T_{620}$ of the conductive patterns 620 are slanted. In some embodiments, the top surfaces $T_{620}$ of the conductive patterns 620 form ramps toward the point directly above the center of the semiconductor die 100. In some embodiments, the top surfaces $T_{620}$ of the conductive patterns 620 have a slope ranging between about 0 degrees to about 60 degrees.

Continue to FIG. 2I with reference to FIGS. 4B and 5A-5B, when forming the conductive patterns 620, the dummy conductive patterns 620D are formed in the $OP_{610c}$ of the first patterned dielectric layer 610 to be in physical contact with the dummy TIVs 400D. The dummy conductive patterns 620D may include the seed layer patterns 620a' and the conductive material patterns 620b' formed thereon. In some embodiments, the dummy conductive patterns 620D is not electrically connected to the conductive patterns 620 formed on the TIVs 400 and the conductive pads 130. For example, the dummy conductive patterns 620D and the underlying dummy TIVs 400D are electrically floating. In some embodiments, the dummy conductive patterns 620D formed on the dummy TIVs 400D are designed to serve as alignment marks (or alignment patterns) for the subsequent patterning process.

For example, the openings (not shown) of the photoresist layer PR for forming the dummy conductive patterns 620D are designed to have distinguishable pattern openings. In some embodiments, the openings (not shown) of the photoresist layer PR for forming the dummy conductive patterns 620D includes patterns such as a discrete-circular shape, an hourglass shape, a discrete-strip shape, a crossed shape, a square shape, a combination of these, etc. It is appreciated that the openings of the photoresist layer PR for forming the dummy conductive patterns 620D may have any shape or pattern, as long as they can be identified during the subsequent processing.

After forming the conductive material patterns on the seed material layer, removing the photoresist layer, and etching the excess seed material layer that is unmasked by the conductive material patterns, the dummy conductive patterns 620D are formed. For example, the dummy conductive patterns 620D are formed during the same step of forming the conductive patterns 620. In other embodiments, the dummy conductive patterns 620D are formed prior to or after forming the conductive patterns 620. In some embodiments, as shown in FIG. 5B, the dummy conductive patterns 620D include distinguishable patterns having such as a discrete-circular shape, an hourglass shape, a discrete-strip shape, a crossed shape, a square shape, a combination of these, etc. In some embodiments, the dimension of the dummy conductive patterns 620D may range from about 1 μm to about 100 μm. The shapes of the dummy conductive patterns 620D are the same or similar to those of the openings $OP_{610c}$ of the first patterned dielectric layer 610. In some other embodiments, the shapes of the openings of the photoresist layer PR for forming the dummy conductive patterns 620D are different to those of the openings $OP_{610c}$ of the first patterned dielectric layer 610. It should be appreciated that the shape and the size of the dummy conductive patterns 620D illustrated in FIG. 5B are merely examples, and the disclosure is not limited thereto.

Referring to FIG. 2J and also with reference to FIG. 2I, a second patterned dielectric layer 630 is formed on the first patterned dielectric layer 610 to cover the conductive patterns 620. For example, the conductive patterns 620 are interposed between the first patterned dielectric layer 610 and the second patterned dielectric layer 630. In some embodiments, a material of the second patterned dielectric layer 630 includes polyimide, epoxy resin, acrylic resin, phenol resin, BCB, PBO, or any other suitable polymer-based dielectric material. The second patterned dielectric layer 630 may be formed by suitable fabrication techniques such as spin-on coating, CVD, PECVD, or the like. In some embodiments, the second patterned dielectric layer 630 has a second aperture AP2 in communication with the first aperture AP1 of the first patterned dielectric layer 610. The sensing components 120 of the semiconductor die 100 may be accessibly revealed by the second aperture AP2 and the first aperture AP1.

Continue to FIG. 2J and with reference to FIG. 6, when forming the second aperture AP2 of the second patterned dielectric layer 630, the dummy conductive patterns 620D formed on the dummy TIVs 400D may function as alignment marks for mask aligning. In some embodiments where the second aperture AP2 is formed via exposure and development processes, the photomask is positioned based on the dummy conductive patterns 620D. By the configuration of the dummy conductive patterns 620D, the precise alignment between successive dielectric layers (or the second aperture AP2 and the first aperture AP1) may be achieved.

In some embodiments, a maximum width (or a diameter) $W_{AP2}$ of the second aperture AP2 is greater than a maximum width (or a diameter) $W_{AP1}$ of the first aperture AP1. In some embodiments, the first patterned dielectric layer 610, the conductive patterns 620, and the second patterned dielectric layer 630 are collectively referred to as a redistribution structure 600. The redistribution structure 600 is formed over the semiconductor die 100, the TIVs 400, and the etched encapsulant 500A. In some embodiments, the redistribution structure 600 has an opening (e.g., the first aperture AP1 and the second aperture AP2) accessibly exposing the sensing components 120 of the semiconductor die 100. For example, the sensing components 120 of the semiconductor die 100 are unmasked by the redistribution structure 600. In some alternative embodiments in which the sensing component 120 includes an optical sensor, the sensing component 120 is optically exposed by the redistribution structure 600.

In some embodiments, the second patterned dielectric layer 630 follows the profiles of the top surfaces of the underlying first patterned dielectric layer 610 and the conductive patterns 620. For example, a top surface $T_{630}$ of the second patterned dielectric layer 630 (e.g., a top surface $T_{600}$ of the redistribution structure 600) is slanted. For example, the top surface $T_{630}$ of the second patterned dielectric layer 630 (e.g., the top surface $T_{600}$ of the redistribution structure 600) forms a ramp toward the point directly above the center of the semiconductor die 100. In some embodiments, the top surface $T_{630}$ of the second patterned dielectric layer 630 (e.g., the top surface $T_{600}$ of the redistribution structure 600) has a slope ranging between about 0 degrees to about 70 degrees. It is noted that the slope of the top surface $T_{630}$ of the second patterned dielectric layer 630 may change depending on the thickness of the second patterned dielectric layer 630. For example, the increase of thickness of the second patterned dielectric layer 630 may render the gentler slanting top surface $T_{630}$.

In some embodiments, the surface roughness of the top surface $T_{630}$ of the second patterned dielectric layer 630 is less than the surface roughness of the top surface $T_{500A}$ of the etched encapsulant 500A. The surface roughness of the top surface $T_{600}$ of the redistribution structure 600 may also be less than the top surface $T_{500A}$ of the etched encapsulant 500A. In some embodiments, the top surface $T_{600}$ of the redistribution structure 600 has the surface roughness ranging between about 0.01 μm and about 2 μm. It is noted that the illustration of the second patterned dielectric layer 630 is merely an example, and the second patterned dielectric layer 630 may be a multi-layered dielectric structure or may have a flat and smooth top surface. The number of the dielectric layer or the thickness of the second patterned dielectric layer 630 may change depending on product requirements, and the disclosure is not limited thereto.

Referring to FIG. 2K, the carrier substrate C is removed to expose the dielectric layer 200. For example, the dielectric layer 200 is de-bonded from the de-bonding layer DB such that the dielectric layer 200 is separated from the carrier substrate C. In some embodiments, the de-bonding layer DB (e.g., the LTHC release layer) is irradiated by an UV laser such that the dielectric layer 200 may be peeled off from the carrier C. Other suitable removal methods (grinding, etching, etc.) may be used to release the carrier substrate C.

Referring to FIG. 2L, a portion of the dielectric layer 200 is subsequently removed to form a backside patterned dielectric layer 200A having a plurality of contact openings $OP_{200}$, where the contact openings $OP_{200}$ may accessibly expose at least a portion of the redistribution structure 300 for further electrical connection. For example, the contact openings $OP_{200}$ accessibly expose the seed layer patterns 302 of the redistribution structure 300. In some embodiments, the contact openings $OP_{200}$ of the backside patterned dielectric layer 200A are formed by a laser drilling process or a mechanical drilling process. Other suitable removal processes (e.g., lithography and etching or the like) may be used to form the contact openings $OP_{200}$.

Continue to FIG. 2L, after the backside patterned dielectric layer 200A is formed, a plurality of conductive terminals 700 are formed in the contact openings $OP_{200}$ such that the conductive terminals 700 are electrically coupled to the TIVs 400 through the redistribution structure 300. The conductive terminals 700 may be electrically coupled to the semiconductor die 100 through the redistribution structure 300, the TIVs 400, and the redistribution structure 600. The conductive terminals 700 may be or may include solder balls, ball grid array (BGA) balls, or controlled collapse chip connection (C4) bumps, etc. In some embodiments, the conductive terminals 700 are made of a conductive material with low resistivity, such as Sn, Pb, Ag, Cu, Ni, Bi, or an alloy thereof, etc.

In some embodiments, the above steps are performed in wafer level, and after the conductive terminals 700 are formed, a singulation process is performed on the resulting structure to form a plurality of semiconductor packages 10. For example, the dicing process or the singulation process involves dicing with a rotating blade or a laser beam. In some embodiments, the dicing or singulation process includes a laser cutting process, a mechanical cutting process, or other suitable processes. Up to here, the manufacture of the semiconductor package 10 as shown in FIG. 2L is completed.

In some embodiments, the semiconductor package 10 is mounted on a package component (not shown) to form an electronic device. The package component may be or may include a printed circuit board (PCB), a printed wiring board, interposer, package substrate, and/or other carrier that is capable of carrying integrated circuits. The electronic device including the semiconductor package 10 may be part of an electronic system for such as sensing devices, computational devices, wireless communication devices, computer-related peripherals, entertainment devices, etc. It should be noted that other electronic applications are also possible.

Figure 7A:
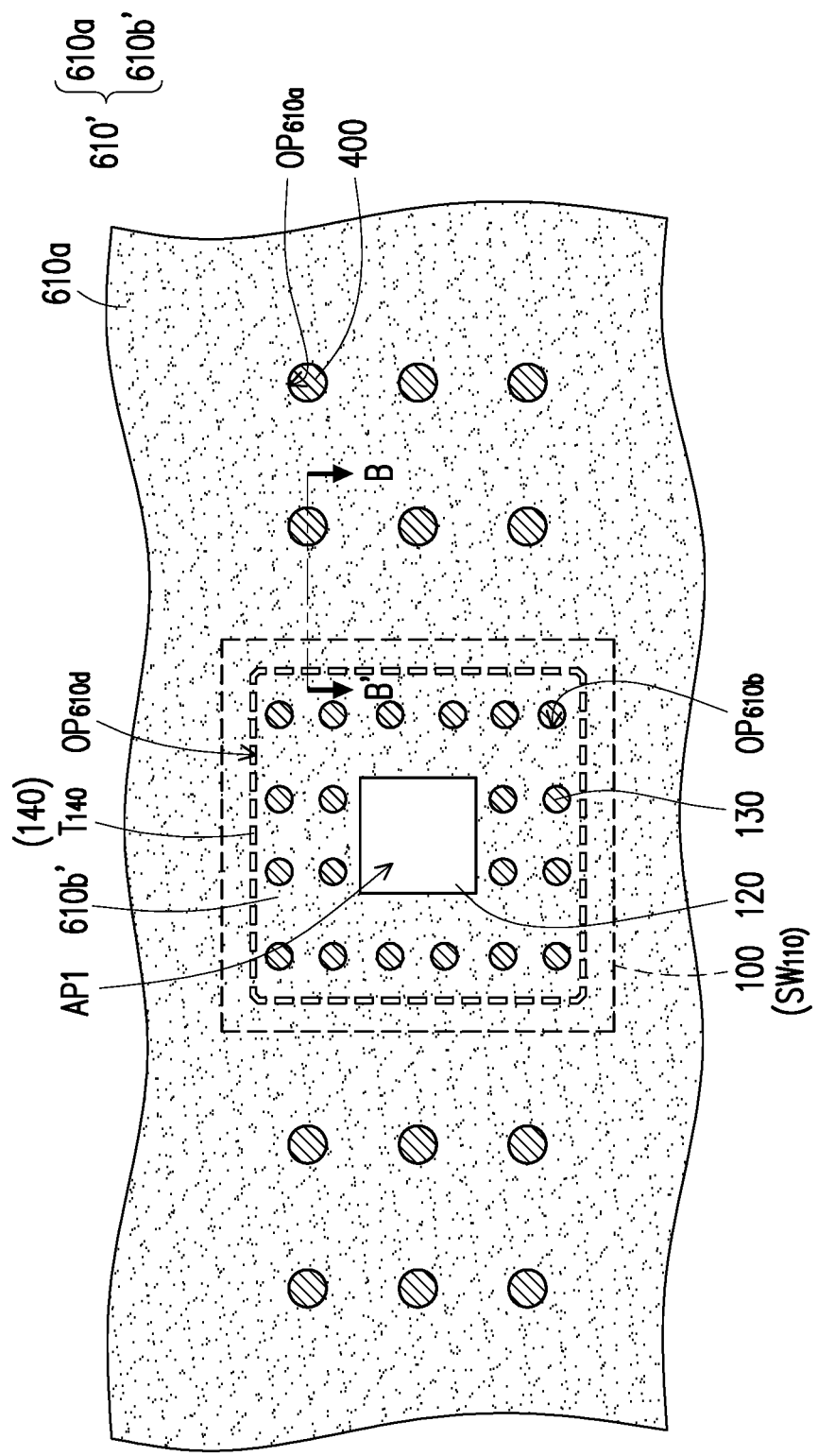
FIG. 7A is a schematic top view of FIG. 2F in accordance with some alternative embodiments.
Figure 7C:
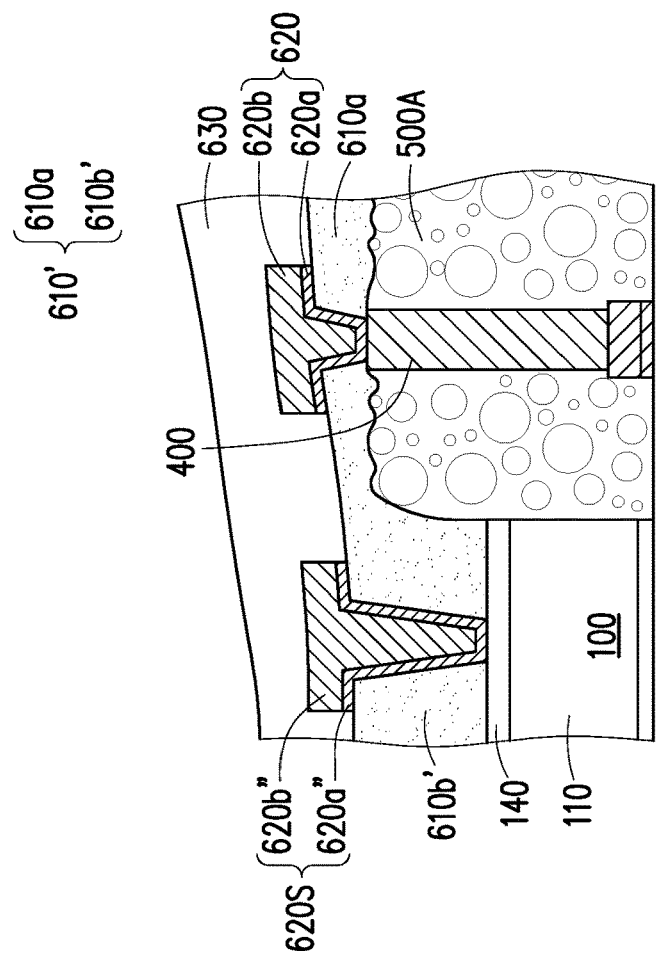
FIG. 7C is a schematic cross-sectional view illustrating conductive patterns and a second dielectric layer formed on the structure shown in FIG. 7B in accordance with some embodiments.
Figure 7B:
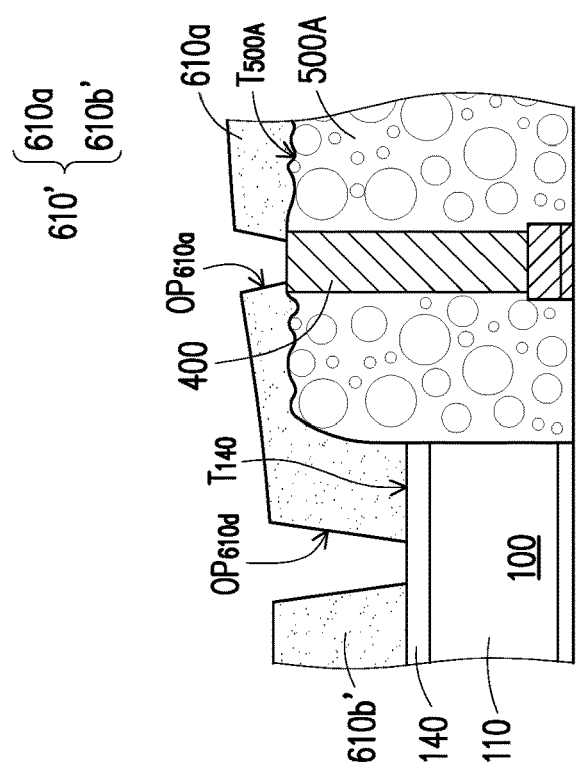
FIG. 7B is a schematic cross-sectional view illustrating partial structure taken along line B-B' in FIG. 7A in accordance with some embodiments.

FIG. 7A is a schematic top view of FIG. 2F in accordance with some alternative embodiments, FIG. 7B is a schematic cross-sectional view illustrating partial structure taken along line B-B' in FIG. 7A in accordance with some embodiments, and FIG. 7C is a schematic cross-sectional view illustrating conductive patterns and a second dielectric layer formed on the structure shown in FIG. 7B in accordance with some embodiments. Throughout the various views and illustrative embodiments of the present invention, like reference numbers are used to designate like elements.

Referring to FIGS. 7A-7B and also with reference to FIGS. 2F and 4A, the structure shown in FIG. 7A is similar to the structure shown in FIG. 4A. The difference therebetween includes that the openings $OP_{610c}$ are omitted and a plurality of openings $OP_{610d}$ are formed to expose a portion of the patterned passivation layer 140 of the semiconductor die 100. In some embodiments, the openings $OP_{610c}$ and the underlying dummy TIVs 400D (shown in FIG. 4A) are omitted. In some other embodiments, the openings $OP_{610c}$ are omitted, but the dummy TIVs 400D are remained and covered by the first patterned dielectric layer 610' for alleviating a loading effect or for other intended purposes.

For example, the openings $OP_{610d}$ are formed during the same step of forming the openings ($OP_{610a}$ and $OP_{610b}$) and the first aperture AP1. In some embodiments, the openings $OP_{610d}$ are formed by positioning the alignment mark (not shown) on the conductive pads 130. In some embodiments, the openings $OP_{610d}$ are formed within the region defined by the sidewalls $SW_{110}$ of the semiconductor die 100. For example, the second portion 610b' of the first patterned dielectric layer 610' includes the openings $OP_{610b}$, the openings $OP_{610d}$, and the first aperture AP1. The first aperture AP1 may be surrounded by the openings $OP_{610b}$, and the openings $OP_{610d}$ may be arranged to surround the openings $OP_{610b}$. In some embodiments, the openings $OP_{610d}$ are formed as a sporadic trench along the periphery of the region defined by the sidewalls $SW_{110}$ of the semiconductor die 100. In some other embodiments, the openings $OP_{610d}$ may not be arranged in a path surrounding the sidewalls $SW_{110}$ of the semiconductor die 100. Alternatively, the opening $OP_{610d}$ may be a patterned opening on the border region (or corner) defined by the sidewalls $SW_{110}$ of the semiconductor die 100.

For example, the openings $OP_{610d}$ may be designed to serve as alignment marks (or alignment openings) for the subsequent patterning process. Since the surface roughness of the top surface $T_{500A}$ of the etched encapsulant 500A is greater than that of the top surface $T_{140}$ of the patterned passivation layer 140 of the semiconductor die 100, the alignment openings (i.e. the openings $OP_{610d}$) accessibly exposing the top surface $T_{140}$ of the patterned passivation layer 140 may provide improved alignment control for forming the conductive patterns 620 on the TIVs 400 and the conductive pads 130. In some embodiments, as shown in FIG. 7A, the openings $OP_{610d}$ includes a distinguishable pattern having such as a rectangular shape, a strip shape, a square shape, a combination of these, etc. It is appreciated that the openings $OP_{610d}$ may have any shape or pattern, as long as they can be identified during the subsequent processing. In some embodiments, the dimension of the respective opening $OP_{610d}$ ranges from about 1 μm to about 100 μm. It should be appreciated that the shape, the size, and the arrangement of the openings $OP_{610d}$ illustrated in FIG. 7A are merely examples, and the disclosure is not limited thereto.

Referring to FIG. 7C, after forming the first patterned dielectric layer 610', the conductive patterns 620 and the second patterned dielectric layer 630 are sequentially formed. In some embodiments, when forming the conductive patterns 620 on the TIVs 400 and the conductive pads 130 of the semiconductor die 100, the openings $OP_{610d}$ exposing the top surface $T_{140}$ of the patterned passivation layer 140 may exhibit a clear pattern for pattern recognition, so that the photomask for forming the openings of the photoresist layer (as described in FIGS. 2H and 5A) may be properly positioned. The more accurate the photomask is positioned, the better the alignment between the subsequently formed conductive patterns 620 and the underlying conductive pads 130 (or the underlying TIVs 400).

In some embodiments, when forming the conductive patterns 620 on the conductive pads 130 of the semiconductor die 100 and the TIVs 400, dummy conductive patterns 620S are simultaneously formed in the openings OP$_{610d}$ of the first patterned dielectric layer 610'. For example, the dummy conductive patterns 620S include the seed layer patterns 620a" physically connected to the patterned passivation layer 140 of the semiconductor die 100, and the conductive material patterns 620b overlying the seed layer patterns 620a". In some embodiments, the dummy conductive patterns 620S may have a shape similar to the openings OP$_{610d}$ shown in FIG. 7A. In some embodiments, the dummy conductive patterns 620S are formed as a continuous path or a sporadic pattern along the sidewalls SW$_{110}$ of the semiconductor die 100. The dummy conductive patterns 620S may be referred to as a seal ring in accordance with some embodiments. It is noted that the seal ring need not be a complete "ring." In some embodiments, the seal ring formed by the dummy conductive patterns 620S may be interposed between the active circuit region (e.g., the region where the conductive pads 130 are distributed on) of the semiconductor die 100 and the TIVs 400. In some embodiments, the seal ring formed by the dummy conductive patterns 620S may serve as a metal protection to block propagation of a crack or delamination.

In some embodiments, after forming the conductive patterns 620 and the dummy conductive patterns 620S, the second patterned dielectric layer 630 is formed on the first patterned dielectric layer 610' to cover the conductive patterns 620 and the dummy conductive patterns 620S. For example, the dummy conductive patterns 620S may serve as alignment marks when forming the second aperture AP2 (shown in FIG. 2J) of the second patterned dielectric layer 630. In some embodiments, after the second patterned dielectric layer 630 is formed, the dummy conductive patterns 620S formed on the semiconductor die 100 are electrically floating. For example, the dummy conductive patterns 620S are electrically isolated by the patterned passivation layer 140 and the first patterned dielectric layer 610'.

Figure 8A:
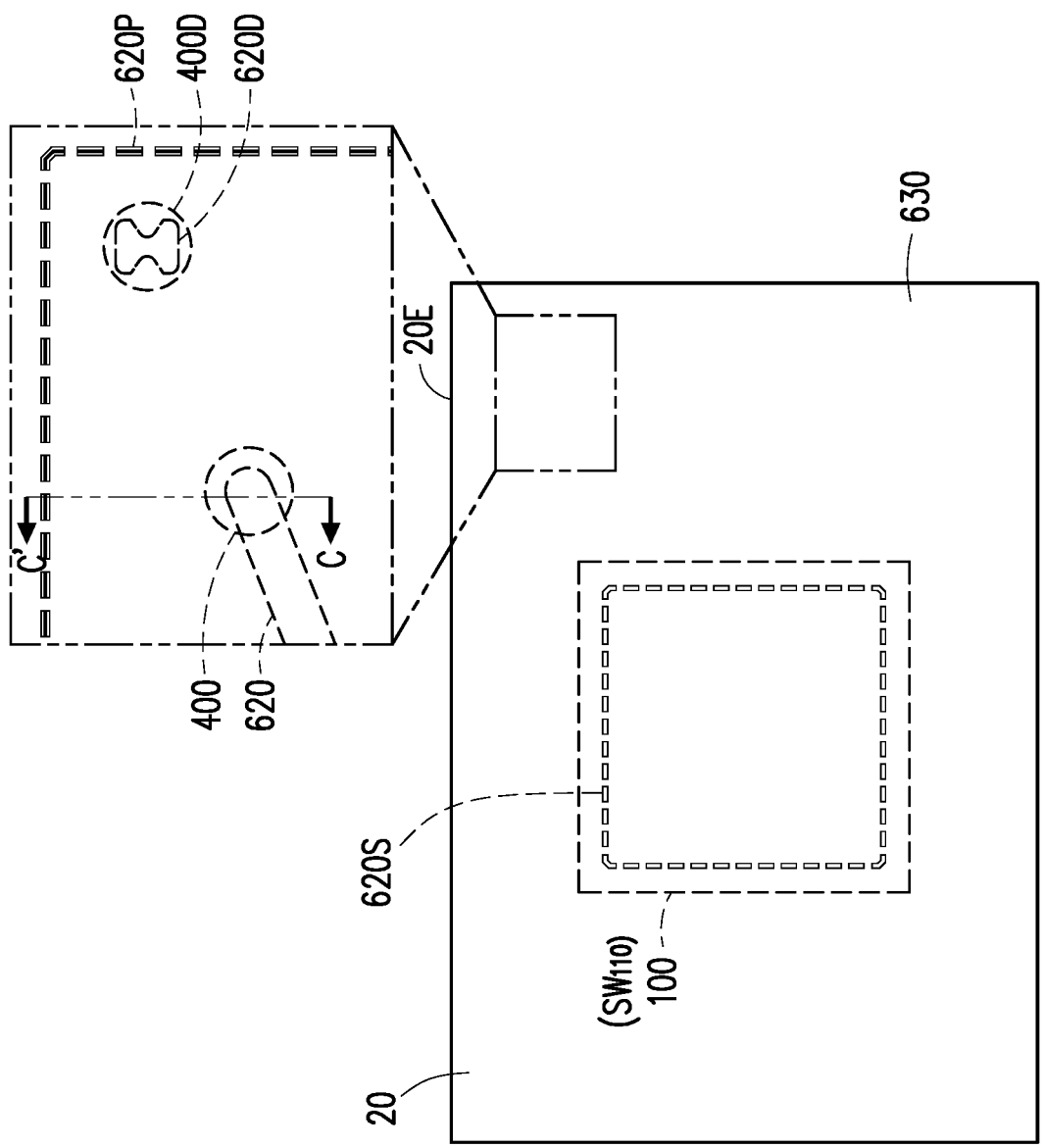
FIG. 8A is a schematic top view of a semiconductor package in accordance with some alternative embodiments.
Figure 8B:
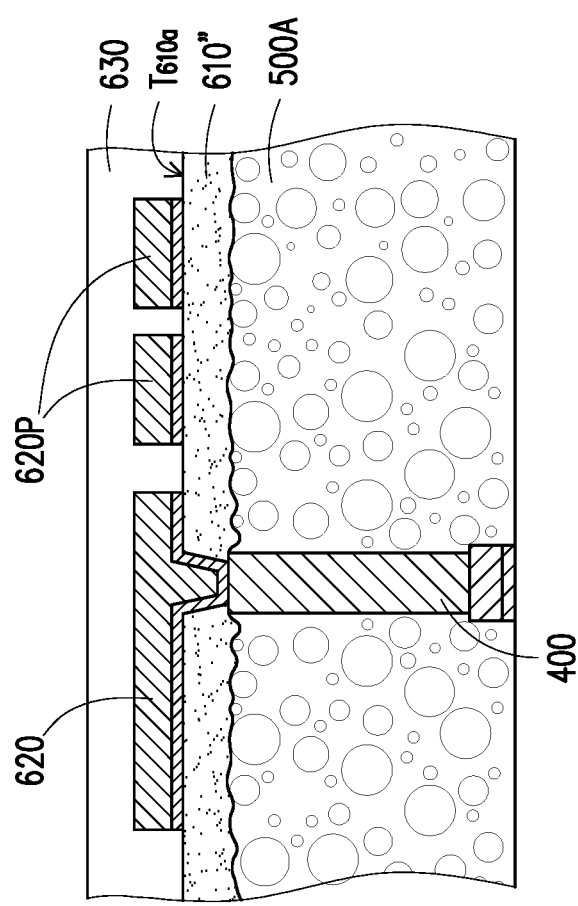
FIG. 8B is a schematic cross-sectional view illustrating partial structure taken along line C-C' in FIG. 8A in accordance with some embodiments.

FIG. 8A is a schematic top view of a semiconductor package in accordance with some alternative embodiments, and FIG. 8B is a schematic cross-sectional view illustrating partial structure taken along line C-C' in FIG. 8A in accordance with some embodiments. Throughout the various views and illustrative embodiments of the present invention, like reference numbers are used to designate like elements.

Referring to FIGS. 8A-8B, a semiconductor package 20 is provided. It is noted that the semiconductor package 20 is similar to the semiconductor package 10 described above, and a plurality of elements of the semiconductor package 20 are not shown for ease of description. For example, the semiconductor package 20 includes the dummy conductive patterns 620S formed within the region defined by the sidewalls SW$_{110}$ of the semiconductor die 100. The dummy conductive patterns 620S may be similar to the dummy conductive patterns 620S described in FIGS. 7A-7C, so the detailed descriptions are not repeated for the sake of brevity. In some embodiments, the dummy TIV 400D is disposed at the corner of the semiconductor package 20. For example, the shortest distance between the TIV 400 and the semiconductor die 100 is less than the shortest distance between the dummy TIV 400D and the semiconductor die 100. The dummy TIV 400D may be similar to the dummy TIV 400D described in FIG. 3, so the detailed descriptions are not repeated for the sake of brevity. It is appreciated that the dummy conductive patterns formed on the dummy TIV 400D are not shown in FIG. 8A, but it should be understood that the dummy conductive patterns are similar to the dummy conductive patterns described in FIGS. 5A-5B. The subsequent processes (e.g., forming the dummy conductive patterns 620D and the second patterned dielectric layer 630) performed on the dummy TIV 400D may be similar to the processes described in FIGS. 4A-4B, 5A and 6, so the detailed descriptions are not repeated for the sake of brevity.

In some embodiments, the semiconductor package 20 includes dummy conductive patterns 620P formed in proximity to at least one edge 20E of the semiconductor package 20. The dummy conductive patterns 620P may include an inner portion and an outer portion disposed side by side and spaced apart from one another. For example, the inner portion of the dummy conductive patterns 620P is disposed close to the dummy TIV 400D, and the outer portion of the dummy conductive patterns 620P is disposed between the edge of the semiconductor package 20 and the inner portion. The inner portion and the outer portion of the dummy conductive patterns 620P may be arranged along the edges of the semiconductor package 20. For example, the dummy conductive patterns 620P are formed during the same step of forming the dummy conductive patterns 620D and the conductive patterns 620 as described in FIG. 5A. In some embodiments, the dummy conductive patterns 620P are formed during the same step of forming the dummy conductive patterns 620S as described in FIG. 7C. In some embodiments, the dummy conductive patterns 620P (e.g., similar to the dummy conductive patterns 620S) may serve as alignment marks for the subsequent mask aligning process. It is noted that the shape and the arrangement of the dummy conductive patterns 620P shown in FIG. 8A is merely an example and may be adjusted depending on product and process requirements.

As shown in FIG. 8B, the dummy conductive patterns 620P are formed on the top surface T$_{610a}$ of the first patterned dielectric layer 610". In some embodiments, the dummy conductive patterns 620P are free of via portion. For example, the first patterned dielectric layer 610" may not be penetrated by the dummy conductive patterns 620P, and the dummy conductive patterns 620P is not in physical contact with the etched encapsulant 500A and is spaced apart from the etched encapsulant 500A by the first patterned dielectric layer 610". In some other embodiments, a portion of the dummy conductive patterns 620P extends into the first patterned dielectric layer 610" to be in direct contact with the etched encapsulant 500A. In some embodiments, the dummy conductive patterns 620P are electrically floating in the semiconductor package 20. In some embodiments, the dummy conductive patterns 620P are arranged along the edges 20E of the semiconductor package 20. In some embodiments, the dummy conductive patterns (620P and 620S) are referred to as an outer seal ring and an inner seal ring, respectively. Again, it should be noted that the seal ring need not be a complete "ring." In some embodiments, the outer seal ring formed by the dummy conductive patterns 620P may serve as a metal protection to block propagation of a crack or delamination.

According to some embodiments, a semiconductor package includes a semiconductor die, an encapsulant, a through insulator via (TIV) and a dummy TIV, a patterned dielectric layer, a conductive pattern, and a first dummy conductive pattern. The semiconductor die includes a sensing component, the encapsulant extends along sidewalls of the semiconductor die, the TIV and the dummy TIV penetrate through the encapsulant and are disposed aside the semiconductor die, the patterned dielectric layer is disposed on the encapsulant and exposes the sensing component of the semiconductor die, the conductive pattern is disposed on the patterned dielectric layer and extends to be in contact with the TIV and the semiconductor die, and the first dummy conductive pattern is disposed on the patterned dielectric layer and connected to the dummy TIV through an alignment opening of the patterned dielectric layer. The semiconductor die is in a hollow region of the encapsulant, and a top width of the hollow region is greater than a width of the semiconductor die.

According to some alternative embodiments, a semiconductor package includes a semiconductor die, an encapsulant, a through insulator via (TIV), a first patterned dielectric layer, a conductive pattern, and a dummy conductive pattern. The semiconductor die includes a patterned passivation layer and a sensing component unmasked by the patterned passivation layer, the encapsulant extends along sidewalls of the semiconductor die, the TIV penetrates through the encapsulant and disposed aside the semiconductor die, the first patterned dielectric layer is disposed on the encapsulant and exposes the sensing component of the semiconductor die, the conductive pattern is disposed on the first patterned dielectric layer and extends to be in contact with the TIV and the semiconductor die, and the dummy conductive pattern is disposed on the first patterned dielectric layer and passes through a first alignment opening of the first patterned dielectric layer to be in contact with the patterned passivation layer of the semiconductor die. A surface roughness of the encapsulant is greater than that of the patterned passivation layer.

According to some alternative embodiments, a manufacturing method of a semiconductor package includes at least the following steps. An encapsulant is formed to encapsulate a semiconductor die, a through insulator via (TIV), and a dummy TIV, where a sensing component of the semiconductor die is covered by a sacrificial film. A top surface of the encapsulant is roughened by removing the sacrificial film to reveal the sensing component of the semiconductor die. A first patterned dielectric layer with a first alignment opening is formed on the top surface of the encapsulant. A conductive pattern is formed on the first patterned dielectric layer and in contact with the semiconductor die and TIV under alignment by a first alignment opening of the first patterned dielectric layer which accessibly exposes the dummy TIV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die comprising a sensing component;
   an encapsulant extending along sidewalls of the semiconductor die, the semiconductor die being in a hollow region of the encapsulant, and a top width of the hollow region being greater than a width of the semiconductor die;
   a through insulator via (TIV) and a dummy TIV penetrating through the encapsulant and disposed aside the semiconductor die;
   a patterned dielectric layer disposed on the encapsulant and exposing the sensing component of the semiconductor die;
   a conductive pattern disposed on the patterned dielectric layer and extending to be in contact with the TIV and the semiconductor die; and
   a first dummy conductive pattern disposed on the patterned dielectric layer and connected to the dummy TIV through an alignment opening of the patterned dielectric layer.

2. The semiconductor package of claim 1, wherein a surface roughness of a top surface of the encapsulant is greater than a surface roughness of a top surface of the dummy TIV where the first dummy conductive pattern lands on.

3. The semiconductor package of claim 1, wherein the encapsulant comprises a top surface, an inner sidewall connected to the sidewalls of the semiconductor die, and a curved surface connected to the top surface and the inner sidewall, and the curved surface has a concave-down surface profile in a cross-sectional view.

4. The semiconductor package of claim 3, wherein a portion of the patterned dielectric layer covers the top surface of the encapsulant and extends into the hollow region of the encapsulant to cover the curved surface of the encapsulant and land on the semiconductor die.

5. The semiconductor package of claim 1, wherein the semiconductor die further comprises a patterned passivation layer accessibly exposing the sensing component, and the semiconductor package further comprises:
   a second dummy conductive pattern disposed on the patterned dielectric layer and extending to land on the patterned passivation layer of the semiconductor die.

6. The semiconductor package of claim 5, wherein a top surface of the patterned passivation layer where the second dummy conductive pattern lands on is smoother than a top surface of the encapsulant where the patterned dielectric layer is overlaid.

7. The semiconductor package of claim 1, wherein a top-view shape of the dummy TIV exposed by the alignment opening of the patterned dielectric layer is different from a top-view shape of the TIV exposed by a via opening of the patterned dielectric layer, wherein a portion of the conductive pattern extends into the via opening of the patterned dielectric layer to land on the TIV.

8. A semiconductor package, comprising:
   a semiconductor die comprising a patterned passivation layer and a sensing component unmasked by the patterned passivation layer;
   an encapsulant extending along sidewalls of the semiconductor die, wherein a surface roughness of the encapsulant is greater than that of the patterned passivation layer of the semiconductor die;
   a through insulator via (TIV) penetrating through the encapsulant and disposed aside the semiconductor die;
   a first patterned dielectric layer disposed on the encapsulant and exposing the sensing component of the semiconductor die;
   a conductive pattern disposed on the first patterned dielectric layer and extending to be in contact with the TIV and the semiconductor die; and
   a dummy conductive pattern disposed on the first patterned dielectric layer and passing through a first alignment opening of the first patterned dielectric layer to be in contact with the patterned passivation layer of the semiconductor die.

9. The semiconductor package of claim 8, wherein the encapsulant comprises a top surface, an inner sidewall connected to the sidewalls of the semiconductor die, and a curved surface connected to the top surface and the inner sidewall, and the curved surface has a concave-down surface profile in a cross-sectional view.

10. The semiconductor package of claim 8, wherein a thickness of the semiconductor die is less than a thickness of the encapsulant.

11. The semiconductor package of claim 8, further comprising:
a second patterned dielectric layer disposed on the first patterned dielectric layer to cover the conductive pattern and the dummy conductive pattern, wherein an aperture of the second patterned dielectric layer exposing the sensing component is wider than an aperture of the first patterned dielectric layer exposing the sensing component.

12. The semiconductor package of claim 8, wherein the dummy conductive pattern is located within a border region of the semiconductor die in a top view.

13. The semiconductor package of claim 8, further comprising:
a dummy TIV penetrating through the encapsulant and disposed aside the semiconductor die and the TIV, wherein the surface roughness of the encapsulant is greater than a surface roughness the dummy TIV; and
a dummy conductive pattern disposed on the first patterned dielectric layer to be in contact with the dummy TIV through a second alignment opening of the first patterned dielectric layer.

14. The semiconductor package of claim 8, further comprising:
an outer seal-ring pattern disposed on the first patterned dielectric layer and located in proximity to an edge of the semiconductor package.

15. A manufacturing method of a semiconductor package, comprising:
forming an encapsulant to encapsulate a through insulator via (TIV), a dummy TIV, and a semiconductor die which comprises a sensing component covered by a sacrificial film;
roughening a top surface of the encapsulant by removing the sacrificial film to reveal the sensing component of the semiconductor die;
forming a first patterned dielectric layer with a first alignment opening on the top surface of the encapsulant; and forming a conductive pattern on the first patterned dielectric layer and in contact with the semiconductor die and TIV under alignment by the first alignment opening of the first patterned dielectric layer which accessibly exposes the dummy TIV.

16. The manufacturing method of claim 15, further comprising:
forming a dummy conductive pattern on the first patterned dielectric layer to fill the first alignment opening when forming the conductive pattern; and
forming a second patterned dielectric layer with an aperture on the first patterned dielectric layer under alignment by the dummy conductive pattern, wherein the aperture of the second patterned dielectric layer is in communication with an aperture of the first patterned dielectric layer that accessibly exposes the sensing component of the semiconductor die.

17. The manufacturing method of claim 15, further comprising:
forming a second alignment opening of the first patterned dielectric layer to accessibly expose a patterned passivation layer of the semiconductor die; and
forming a dummy conductive pattern on the first patterned dielectric layer to fill the second alignment opening so as to be in contact with the patterned passivation layer of the semiconductor die.

18. The manufacturing method of claim 17, further comprising:
forming a second patterned dielectric layer with an aperture on the first patterned dielectric layer under alignment by the dummy conductive pattern on the patterned passivation layer, wherein the aperture of the second patterned dielectric layer is in communication with an aperture of the first patterned dielectric layer that accessibly exposes the sensing component of the semiconductor die.

19. The manufacturing method of claim 15, further comprising:
when removing the sacrificial film, removing a portion of an upper inner sidewall of the encapsulant that covers the sacrificial film to form an inner sidewall having a concave-down surface profile in a cross-sectional view.

20. The manufacturing method of claim 15, wherein removing the sacrificial film comprises performing a dry etching process on the sacrificial film, and a plurality of fillers of the encapsulant on the top surface are removed during the dry etching process.

* * * * *